(12) United States Patent
Baek et al.

(10) Patent No.: US 8,084,801 B2
(45) Date of Patent: Dec. 27, 2011

(54) CELL STRUCTURE FOR A SEMICONDUCTOR MEMORY DEVICE AND METHOD OF FABRICATING THE SAME

(75) Inventors: Kyoung-Yun Baek, Anyang-si (KR); Yong-Sun Ko, Suwon-si (KR); Hak Kim, Yongin-si (KR); Yong-Kug Bae, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,255

(22) Filed: Dec. 15, 2009

(65) Prior Publication Data

US 2010/0096681 A1   Apr. 22, 2010

Related U.S. Application Data

(62) Division of application No. 11/581,359, filed on Oct. 17, 2006, now abandoned.

(30) Foreign Application Priority Data

Oct. 18, 2005 (KR) .......................... 10-2005-0097973
Oct. 27, 2005 (KR) .......................... 10-2005-0101860

(51) Int. Cl.
*H01L 21/336* (2006.01)
(52) U.S. Cl. ............ 257/296; 257/208; 257/68; 257/71; 257/E21.658
(58) Field of Classification Search .................. 257/296, 257/68, 71, E21.657, E21.658, E21.646, 257/E27.084, E27.086; 438/262
See application file for complete search history.

(56) References Cited

U.S. PATENT DOCUMENTS

| 2004/0188745 A1* | 9/2004 | Kim et al. .................. 257/306 |
| 2005/0186740 A1 | 8/2005 | Kim |
| 2006/0076599 A1 | 4/2006 | Goo et al. |

FOREIGN PATENT DOCUMENTS

| KR | 272162 | 8/2000 |
| KR | 326811 | 2/2002 |
| KR | 1020030058601 | 7/2003 |
| KR | 1020040008489 | 1/2004 |
| KR | 465632 | 12/2004 |
| KR | 1020050059482 | 6/2005 |

* cited by examiner

*Primary Examiner* — Marcos D. Pizarro
*Assistant Examiner* — Eva Yan Montalvo
(74) *Attorney, Agent, or Firm* — Harness, Dickey & Pierce, P.L.C.

(57) ABSTRACT

In a $6F^2$ cell structure of a memory device and a method of fabricating the same, the plurality of active regions may have a first area at both end portions and a second area at a central portion. A portion of a bit-line contact pad may be positioned on the second area and the other portion may be positioned on a third area of the substrate that may not overlap with the plurality of active regions. The bit line may be connected with the bit-line contact pad at the third area. The cell structure may be more easily formed despite a $6F^2$-structured unit cell. The plurality of active regions may have an elliptical shape including major and minor axes. The plurality of active regions may be positioned in a major axis direction to thereby form an active row, and may be positioned in a minor axis direction in such a structure that a center of the plurality of active regions is shifted from that of an adjacent active region in a neighboring active row.

8 Claims, 21 Drawing Sheets

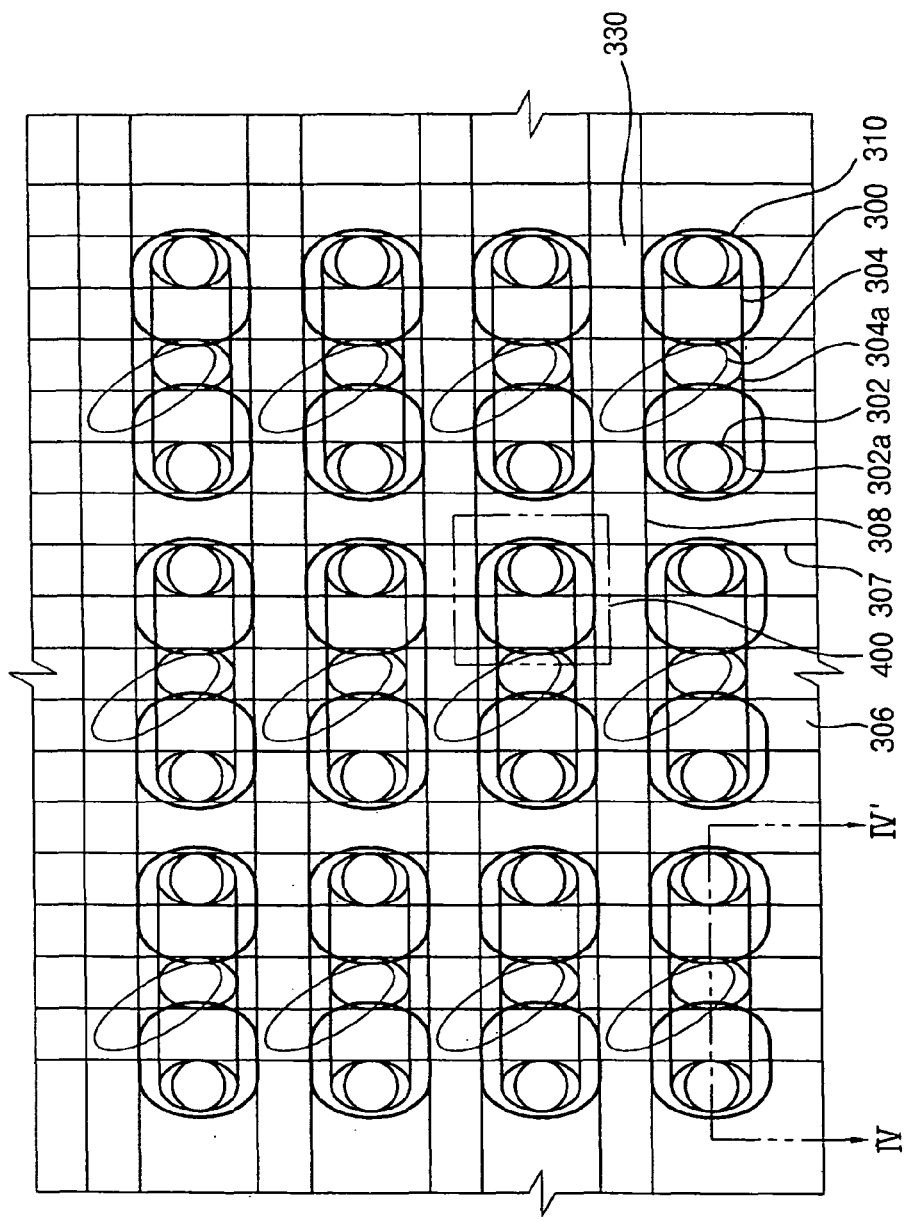

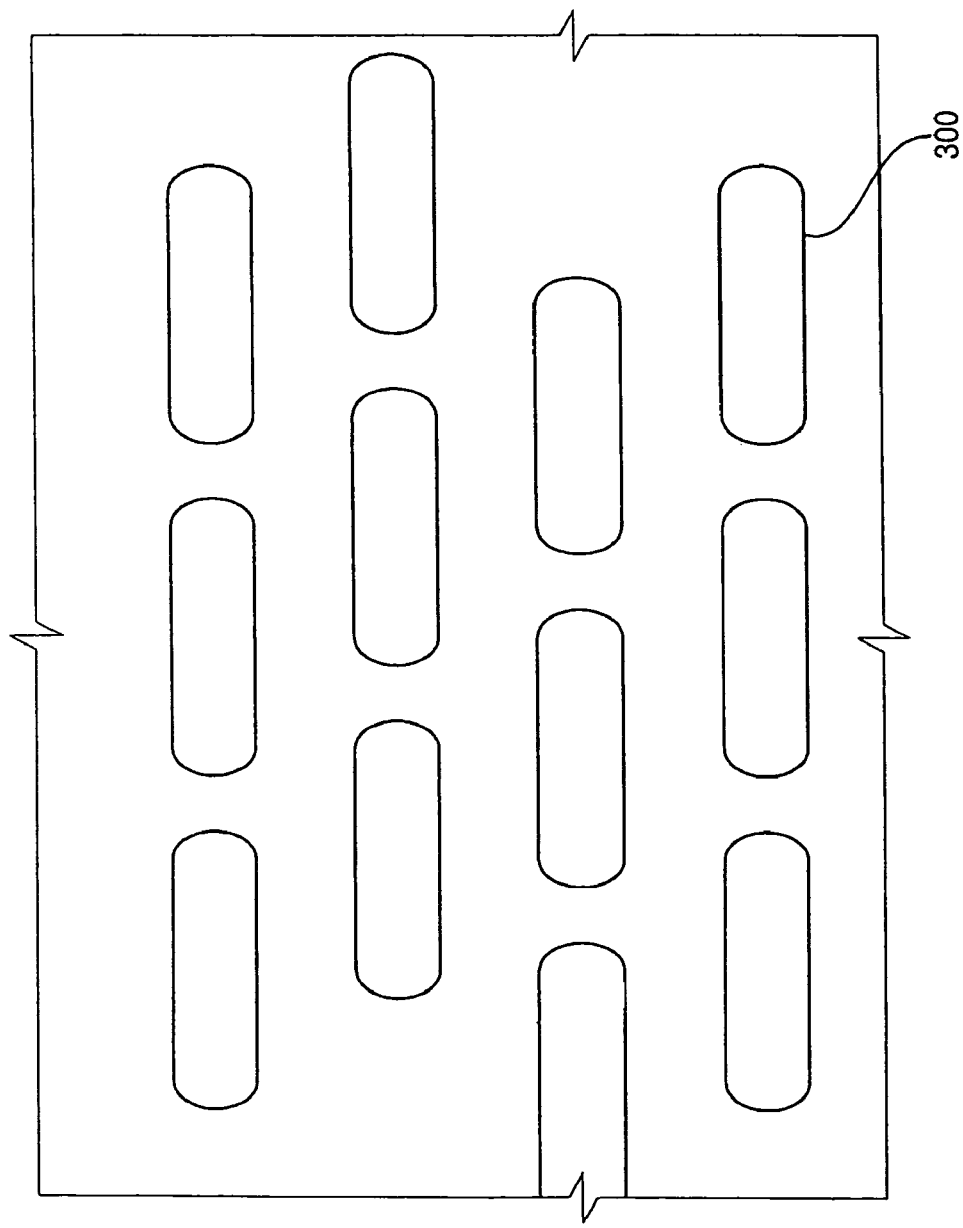

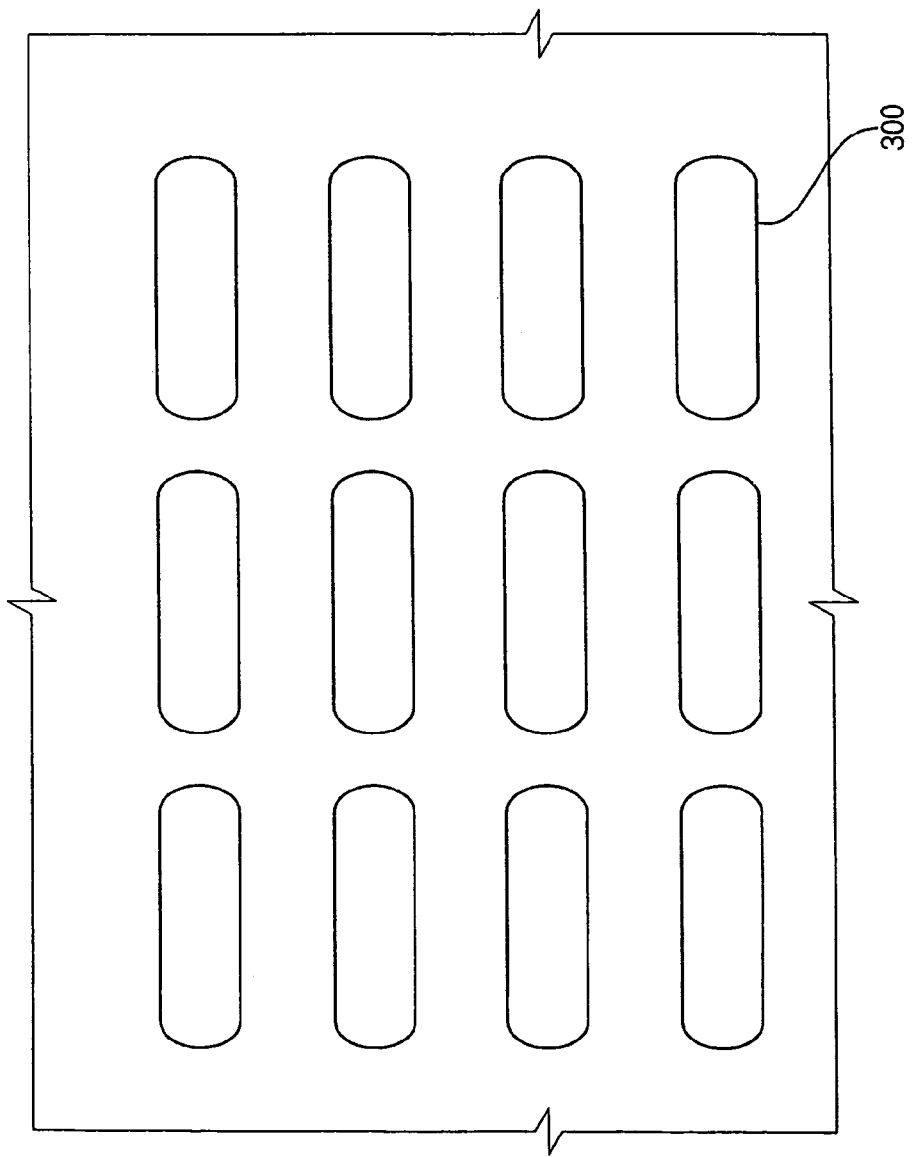

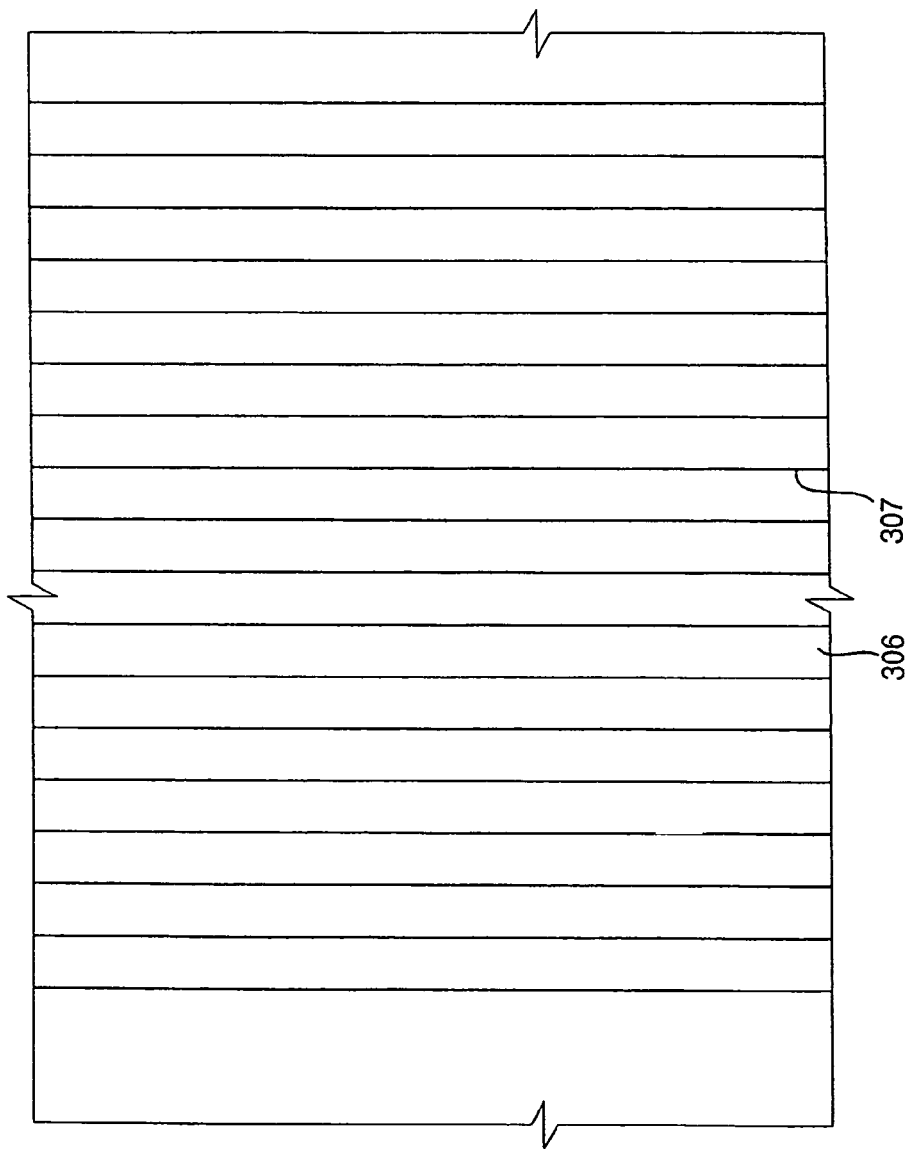

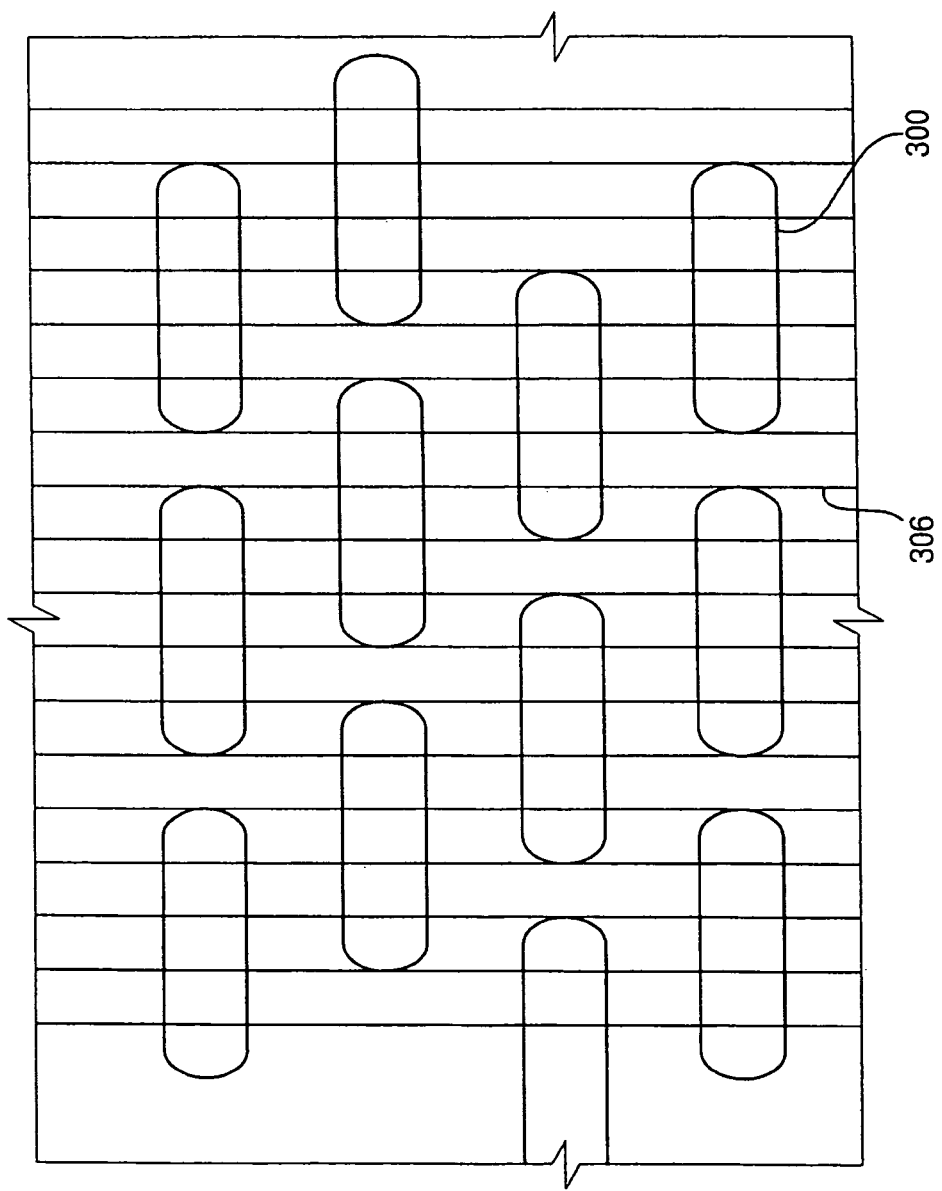

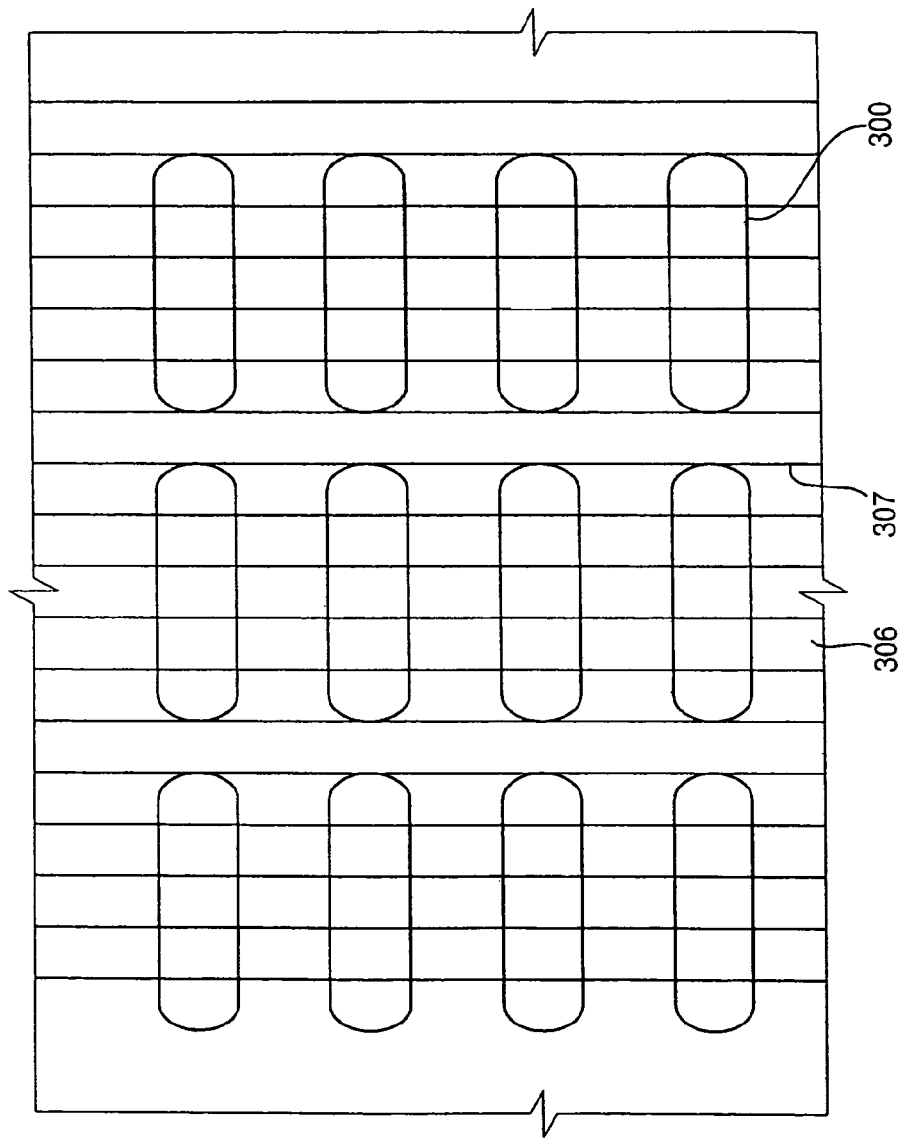

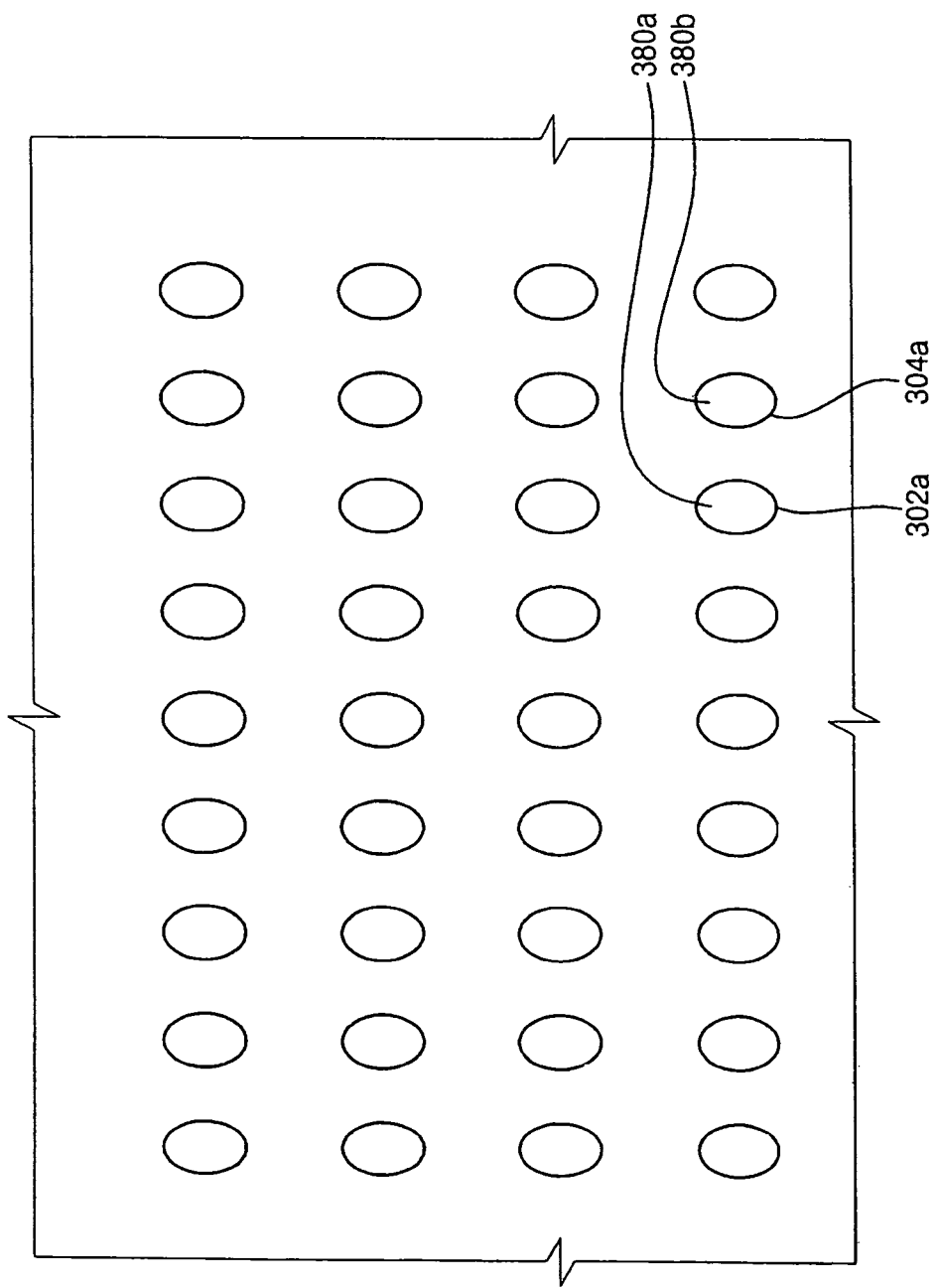

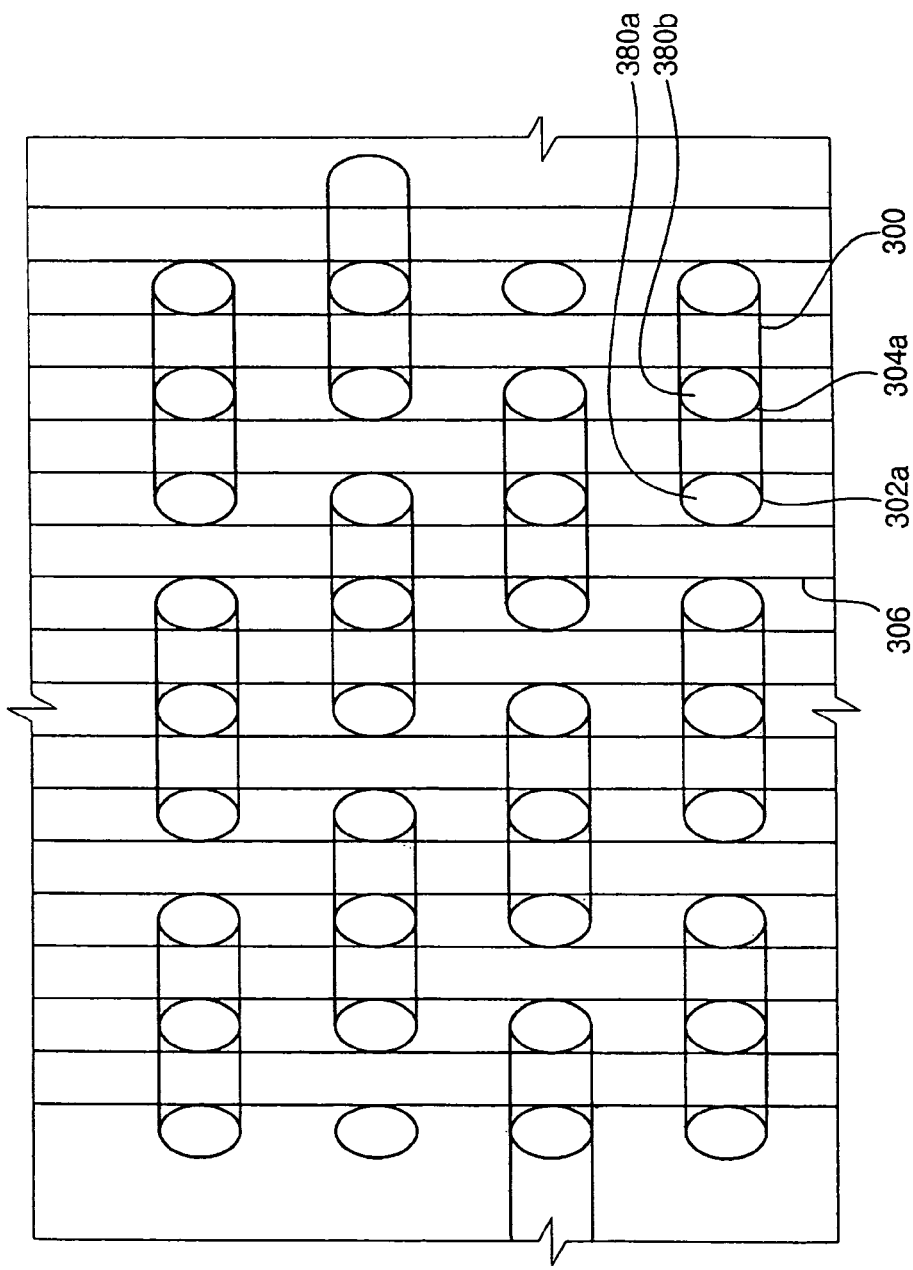

CELL STRUCTURE FOR A SEMICONDUCTOR MEMORY DEVICE AND METHOD OF FABRICATING THE SAME

PRIORITY STATEMENT

This application is a divisional application of U.S. Ser. No. 11/581,359, filed Oct. 17, 2006 now abandoned, which claims priority under 35 USC §119 to Korean Patent Application Nos. 2005-97973 filed on Oct. 18, 2005 and 2005-101860 filed on Oct. 27, 2005, in the Korean Intellectual Property Office (KIPO), the entire contents of which are herein incorporated by reference.

BACKGROUND

1. Field

Example embodiments relate to a cell structure for a semiconductor memory device and a method of fabricating the same. Other example embodiments relate to a cell structure for a semiconductor memory device including a $6F^2$ unit structure and a method of fabricating the same.

2. Description of the Related Art

The size of unit cells of semiconductor memory devices may be reduced due to increasingly smaller or minute design rules, as integration degrees of the memory devices increase. Cell structures of dynamic random-access memory (DRAM) devices have been shifting from an $8F^2$ unit cell structure to a $6F^2$ unit cell structure, so as to satisfy the higher integration degrees of the memory devices. Shifting from the $8F^2$ unit cell structure to the $6F^2$ unit cell structure may cause various processing problems, as follows.

FIG. 1 is a diagram illustrating a cell structure of a conventional semiconductor memory device including an $8F^2$ unit cell. Referring to FIG. 1, an active region 10 of the conventional semiconductor memory device including the $8F^2$ unit cell may make contact with a lower electrode contact pad 12 at both end portions thereof and may make contact with a bit-line contact pad 14 at a central portion thereof. Both end portions of the active region 10 may be referred to as a first area of a substrate, and the central portion of the active region 10 may be referred to as a second area of the substrate. The active region 10 may have an elliptical shape defined by a major axis and a minor axis, and the major axis of the active region 10 may have a length of about 5F and the minor axis of the active region 10 may have a length of about 1F. The capital letter 'F' denotes a minimized or decreased line width of the semiconductor memory device and each of lattices in FIG. 1 occupies an area of the substrate as large as 1F×1F. A longitudinal array of the lattices of the substrate may be referred to as a lattice row, and a latitudinal array of the lattices of the substrate may be referred to as a lattice column.

In the cell structure of the conventional memory device including the $8F^2$ unit cell, the active region 10 may be repeatedly positioned in a direction of the lattice row and spaced apart by a predetermined or given distance from an adjacent active region. The active region 10 may be also repeatedly positioned in a direction of the lattice column under the condition that the centers of the repeated active regions 10 are on the same line, so that the active regions have the same central axis in the direction of the lattice column. The major axis of the active region 10 may be parallel with the lattice row of the substrate and the minor axis of the active region 10 may be parallel with the lattice column of the substrate. A space between the active regions 10 of the substrate may be referred to as a third area of the substrate.

The lower electrode contact pad 12 may be positioned on the first area of the substrate and may make contact with the active region 10, and the bit-line contact pad 14 may be positioned on the second area of the substrate and may make contact with the active region 10. The bit-line contact pad 14 may cross the second area and the third area of the substrate, so that a first portion of the bit-line contact pad 14 may be positioned in the second area of the substrate, and a second portion of the bit-line contact pad 14 may be positioned in the third area of the substrate. The third area of the substrate may correspond to a field region for defining the active region and also may have a length of about 1F.

A gate pattern 16 may be positioned on a gap area between the first and second areas of the active region 10 as a word line of the memory device. The gate pattern 16 may be repeatedly positioned between the upper electrode contact pad 12 and the bit-line contact pad 14 in a direction of the minor axis. A bit line 18 may be positioned in the third area of the substrate, so that the second portion of the bit-line contact pad 14 may make contact with the bit line 18 in the third area of the substrate. A unit cell of a memory cell structure may be classified on the basis of a lower electrode. The lower electrode contact pad 12, which makes contact with the lower electrode, may occupy a lattice area of 4F×2F as shown in FIG. 1, so that the cell structure of the memory cell may include the $8F^2$ unit cell 20.

FIG. 2 is a diagram illustrating a cell structure of a conventional semiconductor memory device including a $6F^2$ unit cell. Referring to FIG. 2, an active region 30 of the conventional semiconductor memory device including the $6F^2$ unit cell may make contact with a lower electrode contact pad 32 at both end portions thereof and may make contact with a bit-line contact pad 34 at a central portion thereof. Both end portions of the active region 30 may be referred to as a first area of a substrate, and the central portion of the active region 30 may be referred to as a second area of the substrate. The active region 30 may have an elliptical shape defined by a major axis and a minor axis, and the major axis of the active region 10 may have a length of about 5F, and the minor axis of the active region 30 may have a length of about 1F. In the same way as the cell structure including the $8F^2$ unit cell, the capital letter 'F' may denote a minimized or decreased line width of the semiconductor memory device and each of lattices in FIG. 2 may occupy an area of the substrate that may be about 1F×1F.

A longitudinal array of the lattices of the substrate may be referred to as a lattice row and a latitudinal array of the lattices of the substrate may be referred to as a lattice column. In the cell structure of the conventional memory device including the $6F^2$ unit cell, the active region 30 may be repeatedly positioned in an oblique direction that is inclined at a predetermined or given angle with respect to the lattice row and spaced apart by a predetermined or given distance from an adjacent active region in the oblique direction. The end portions of the active region 30 may be positioned on the lattice rows different from each other symmetrically with respect to the second portion of the substrate, and the major axis of the active region 30 may be also inclined at the angle with respect to the lattice row of the substrate. A space between the active regions 30 on the substrate may be referred to as a third area of the substrate.

The cell structure of the memory device including the $6F^2$ unit cell may be the same as that of the memory device including the $8F^2$ unit cell except for the configuration of the active region 30 and the bit-line contact pad 34. The lower electrode contact pad 32 may be positioned on the first area of the substrate and may make contact with the active region 30, and the bit-line contact pad 34 may be positioned on the second area of the substrate and may make contact with the active region 30. The bit-line contact pad 34 may not cross the second area and the third area of the substrate and may only be positioned on the second area of the substrate. The cell structure including the $6F^2$ unit cell may have improved space usage as compared with the cell structure including the $8F^2$ unit cell. The third area of the substrate may correspond to a field region for defining the active region 30 and also may have a length of about 1F.

A gate pattern 36 may be positioned on a gap area between the first and second areas of the active region 30 as a word line of the memory device. The gate pattern 36 may be repeatedly positioned between the upper electrode contact pad 32 and the bit-line contact pad 34 in a direction of the lattice column of the substrate. A bit line 38 may be positioned in the third area of the substrate in a direction of the lattice row of the substrate, and may make contact with the bit-line contact pad 34.

As described above, a unit cell of a memory cell structure may be classified on the basis of a lower electrode. The lower electrode contact pad 32, which may make contact with the lower electrode, may occupy a lattice area of about 3F×2F as shown in FIG. 2, so that the cell structure of the memory cell may include the $6F^2$ unit cell 40. Hereinafter, the cell structure of the memory cell including the $8F^2$ unit cell 20 may be referred to as an $8F^2$ cell structure, and the cell structure of the memory cell including the $6F^2$ unit cell 40 may be referred to as a $6F^2$ cell structure.

The $6F^2$ cell structure may be desirable at a higher integration degree as compared with the $8F^2$ cell structure due to the improved space usage of the $6F^2$ cell structure. The $6F^2$ cell structure may be undesirable in a process for manufacturing the memory device due to the oblique arrangement of the active region 30. For example, a photolithography process may be relatively difficult to be performed on the substrate due to the requirement of the oblique arrangement of the active region 30.

The oblique arrangement of the active region 30 may require an asymmetrical illumination system corresponding to an inclination angle in the photolithography process, and the active region 30 necessarily may include several segments. Optical proximity correction (OPC) of the illumination may be relatively deteriorated, not at the cell area but at the peripheral area of the substrate due to the asymmetry of the illumination system. The field region of the substrate may become relatively non-uniform because several segments may constitute the active region 30. For the above reasons, the $6F^2$ cell structure may have not been used as a cell structure of a memory device despite improved space usage thereof as compared with the $8F^2$ cell structure.

SUMMARY

Example embodiments provide a semiconductor memory device including a $6F^2$ cell structure, of which a plurality of active regions may be horizontally arranged, and a method of fabricating the same. Example embodiments also provide a semiconductor memory device including the $6F^2$ cell structure in a unit cell thereof and a method of fabricating the same.

The semiconductor memory device may include a plurality of active regions of a substrate. Each of the plurality of active regions may have a first area at both end portions and a second area at a central portion. The semiconductor memory device also may include a bit-line contact pad and a bit line electrically connected with the bit-line contact pad. A first portion of the bit-line contact pad may be positioned on the second area of the plurality of active regions and a second portion of the bit-line contact pad may be positioned on a third area of the substrate that may not overlap with the plurality of active regions. The bit line may be electrically connected with the bit-line contact pad at the third area of the substrate, so that the bit line may not overlap with the plurality of active regions.

The plurality of active regions may include an elliptical shape having a major axis and a minor axis. The plurality of active regions may be repeatedly positioned in a direction of the major axis to thereby form an active row, and may be repeatedly positioned in a direction of the minor axis in such a structure that a center of the plurality of active regions is shifted from that of an adjacent active region in a neighboring active row, to thereby form an active column. In example embodiments, no center shift of the plurality of active regions may be performed in the active column, so that the plurality of active regions may be repeatedly positioned in both of the directions of the major axis and minor axis of the plurality of active regions. The bit-line contact pad may have an elliptical shape in such a structure that a major axis of the bit-line contact pad may be inclined with respect to the minor axis of the plurality of active regions. The centers of the plurality of active regions of the active column may be on an oblique line that is inclined at an angle $\theta(0°<\theta<90°)$ with respect to the active row. The third area of the substrate may correspond to a portion of the substrate between a pair of the plurality of active regions, each of which is included in neighboring active rows. The third area of the substrate may include a field region that defines each of the plurality of active regions. A lower electrode contact pad may be positioned on the first area of the plurality of active regions and occupies a lattice surface of the plurality of active regions at about 3F×2F (wherein capital letter 'F' denotes a minimized or decreased line width of the semiconductor memory device), so that a unit cell of the semiconductor memory device may include a $6F^2$ structure.

The semiconductor device may further include a plurality of active regions of a substrate, a plurality of gate patterns, a bit-line contact pad, a bit line, a lower electrode contact pad and a capacitor. The gate patterns may extend in the direction of the minor axis of the plurality of active regions and cross gap areas of the plurality of active regions between the first and second areas of the plurality of active regions. The lower electrode contact pad may make contact with the first area of the plurality of active regions. The capacitor may include a lower electrode that makes contact with the lower electrode contact pad, a dielectric layer on the lower electrode, and an upper electrode on the dielectric layer.

In example embodiments, no center shift of the plurality of active regions may be performed in the active column, so that the plurality of active regions may be repeatedly positioned in both of the directions of the major axis and minor axis of the plurality of active regions. In example embodiments, the semiconductor device further may include a dummy gate pattern positioned between the active columns and extending in the direction of the minor axis of the active region, and the bit-line contact pad may have an elliptical shape in such a structure that a major axis of the bit-line contact pad may be inclined with respect to the minor axis of the plurality of active regions.

According to example embodiments, a method of fabricating a semiconductor memory device may include providing a plurality of active regions on a substrate, each of the active regions having a first area at both end portions and a second area at a central portion, forming a bit-line contact pad of which a first portion is positioned on the second area of the plurality of active regions, and a second portion is positioned on a third area of the substrate that does not overlap with the plurality of active regions and forming a bit line electrically connected with the bit-line contact pad at the third area of the substrate, so that the bit line does not overlap with the plurality of active regions.

According to example embodiments, the plurality of active regions of the semiconductor memory device may be arranged in parallel with the longitudinal direction of the substrate, so that the cell structure may be more easily formed on the substrate despite a $6F^2$-structured unit cell, thereby improving an integration degree of the semiconductor memory device.

BRIEF DESCRIPTION OF THE DRAWINGS

Example embodiments will be more clearly understood from the following detailed description taken in conjunction with the accompanying drawings. FIGS. 1-18 represent non-limiting, example embodiments as described herein.

FIGS. 1 and 2 are diagrams illustrating a cell structure of a conventional semiconductor memory device including an $8F^2$ unit cell and a $6F^2$ unit cell, respectively;

FIG. 3B is a diagram illustrating a modified cell structure of a semiconductor memory device including a $6F^2$ unit cell shown in FIG. 3A;

FIG. 4 is a diagram taken along the line IV-IV' of FIGS. 3A and 3B;

FIGS. 5A to 16 are diagrams illustrating processing steps for manufacturing the semiconductor memory device shown in FIGS. 3A and 3B; and FIGS. 17 and 18 are diagrams illustrating a cell structure manufactured by a conventional process for manufacturing the semiconductor memory device.

DESCRIPTION OF EXAMPLE EMBODIMENTS

Figure 1:
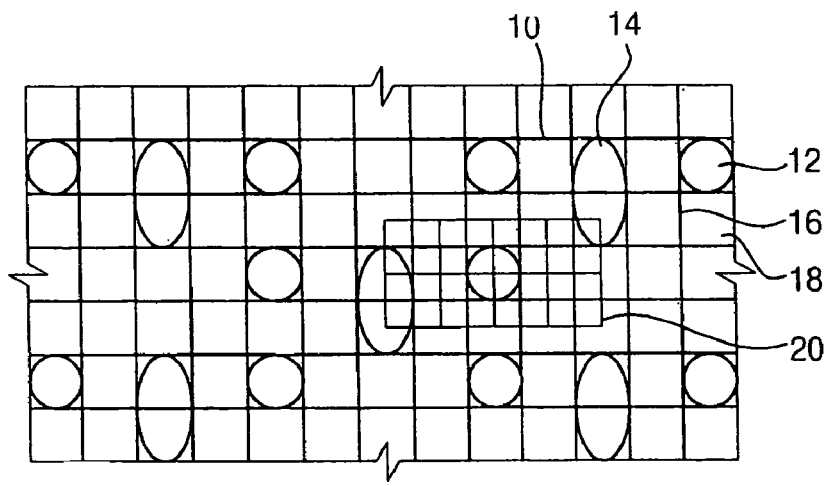
Figure 2:
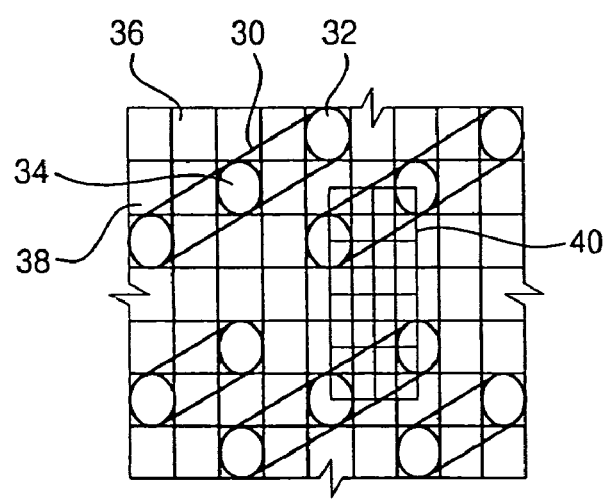

Example embodiments are described more fully hereinafter with reference to the accompanying drawings, in which embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
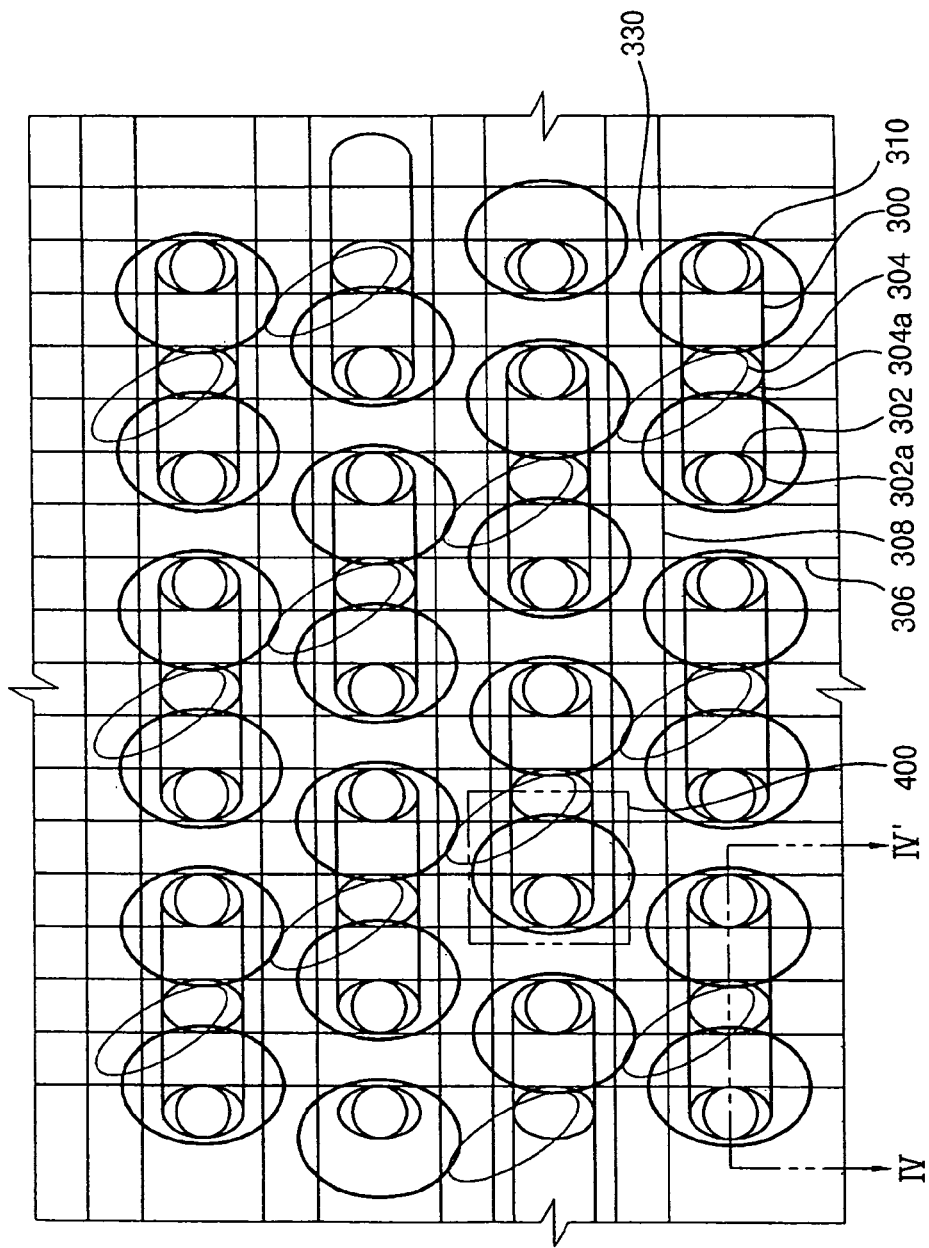
FIG. 3A is a diagram illustrating a cell structure of a semiconductor memory device including a $6F^2$ unit cell in accordance with example embodiments.

FIG. 3A is a diagram illustrating a cell structure of a semiconductor memory device including a $6F^2$ unit cell in accordance with example embodiments. FIG. 3B is a diagram illustrating a modified cell structure of a semiconductor memory device including a $6F^2$ unit cell shown in FIG. 3A. Referring to FIG. 3A, an active region 300 of the $6F^2$ cell structure of the semiconductor memory device may have a shape of an elliptical bar defined by major and minor axes.

The major axis of the active region 300 may have a length of about 5F and the minor axis of the active region 300 may have a length of about 1F. The capital letter 'F' may denote a minimized or decreased line width of the semiconductor memory device and each of lattices in FIG. 3A may occupy a substrate at about 1F×1F. A longitudinal array of the lattices of the substrate may be referred to as a lattice row, and a latitudinal array of the lattices of the substrate may be referred to as a lattice column.

Figure 4:
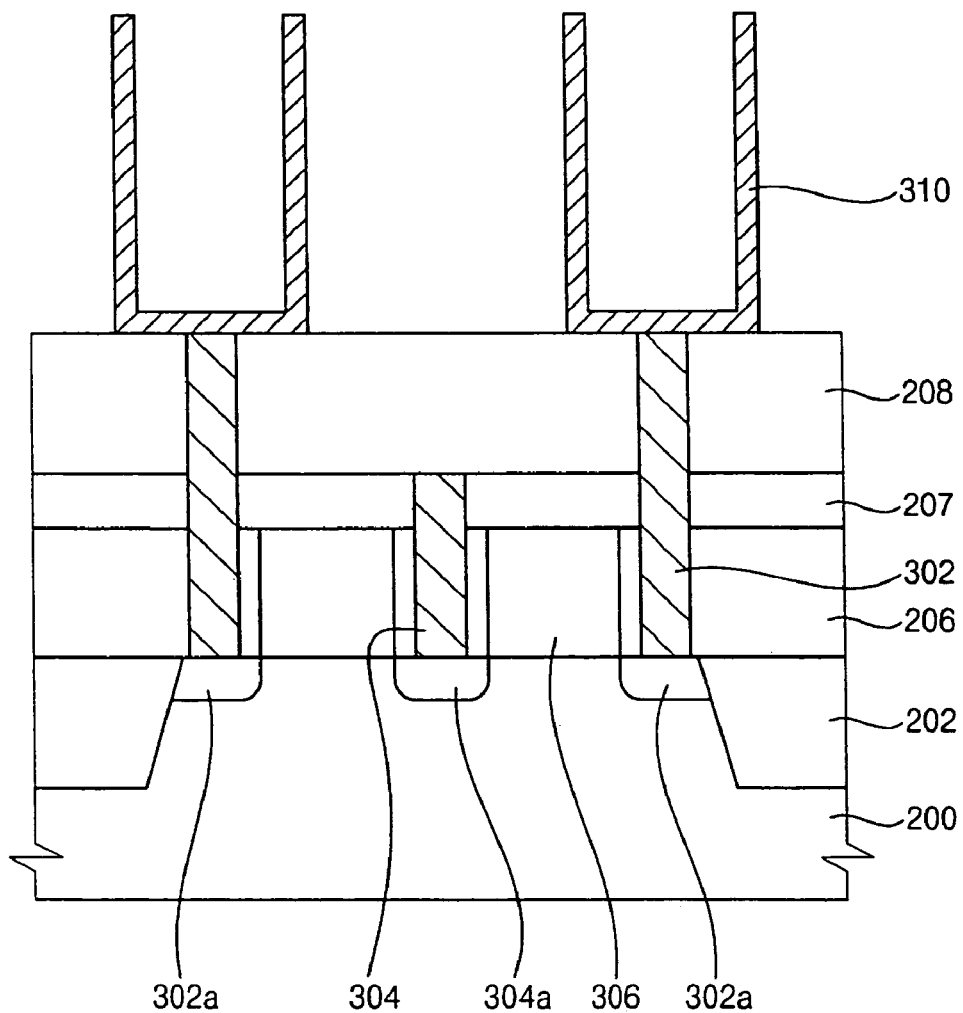

The major axis of the active region 300 may be parallel with the lattice row, and the minor axis of the active region 300 may be parallel with the lattice column. The active region 300 may make contact with a lower electrode contact pad 302 at both end portions 302a thereof and may make contact with a bit-line contact pad 304 at a central portion 304a thereof. Both end portions 302a of the active region 300 may be referred to as a first area of the substrate and the central portion 304a of the active region 300 may be referred to as a second area of the substrate. As shown in FIG. 4, source/drain regions of the semiconductor device may be exposed through the first and second areas 302a and 304a of the substrate. The lower electrode contact pad 302 may make electrical contact with the source/drain regions in the first area 302a, and the bit-line contact pad 304 may make electrical contact with the source/drain regions in the second area 304a.

In example embodiments, the active region 300 may be repeatedly positioned in a direction of the lattice row and spaced apart by a predetermined or given distance from an adjacent active region. The active region 300 may also be repeatedly positioned in a direction of the lattice column under the condition that the centers of the repeated active regions 300 may be shifted by a predetermined or given distance in the direction of the lattice row. The centers of the repeated active regions 300 in the direction of the lattice column may be on a first oblique line that is inclined at a predetermined or given angle $\theta(0°<\theta<90°)$ with respect to the lattice row. A space between the active regions 300 on the substrate positioned in adjacent lattice rows may be referred to as a third area of the substrate, so that the third area 330 of the substrate may correspond to a field region that defines the active region 300 of the substrate.

In example embodiments, the bit-line contact pad 304 may make contact with the third area 330 of the substrate as well as the second area 304a of the substrate. The bit-line contact pad 304 may cross the second area 304a of the substrate corresponding to a central portion of the active region 300, so that centers of the bit-line contact pads 304 may be on a second oblique line that is inclined at substantially the same angle $\theta$ of the first oblique line with respect to the lattice row. The first and second oblique lines may have substantially the same slope of $\tan\theta$ with respect to the lattice row.

A gate pattern 306 may be positioned on a gap area between the first and second areas 302a and 304a in the active region 300 as a word line of the semiconductor memory device. The gate pattern 306 may be repeatedly positioned between the upper electrode contact pad 302 and the bit-line contact pad 304 in the direction of the lattice column of the substrate. The upper electrode contact pad 302 may be positioned at each of the end portions of the active region 300, and the gate pattern 306 may be positioned between the upper electrode contact pad 302 and the bit-line contact pad 304, so that the gate pattern 306 may be positioned at two portions of the active region 300.

As a modified example of the example embodiment shown in FIG. 3B, the active region 300 may be repeatedly positioned in both directions of the lattice row and lattice column and spaced apart by a predetermined or given distance from an adjacent active region. The active regions 300 may be repeatedly positioned along the lattice row and column of the substrate. A dummy gate pattern 307 may be further positioned between the lattice columns of the substrate as well as the gate pattern 306, and may extend in the latitudinal direction of the substrate. A direct formation of the gate pattern 306 on the active region may be relatively difficult to perform, so that the dummy gate pattern 307 may facilitate the formation of the gate pattern 306 on the active region 300. A bit line 308 may be positioned on the bit-line contact pad 304 at the third area 330 in the direction of the lattice row of the substrate, and an upper electrode 310 may be positioned on the upper electrode contact pad 302 at the first area 302a.

The lower electrode contact pad 302, which makes contact with the lower electrode, may occupy a lattice area of about 3F×2F, so that the above-mentioned cell structure of the semiconductor memory device may include the $6F^2$ unit cell 400. The cell structure of the semiconductor memory device of example embodiments may include the active region 300 that is not inclined with respect to the lattice row but parallel with the lattice row despite the $6F^2$ structure of the unit cell 400, thereby improving manufacturing efficiency of the semiconductor memory device. The cell structure of example embodiments may be more suitable to a recent semiconductor device having a higher integration degree.

Hereinafter, processing steps for manufacturing the semiconductor memory device shown in FIG. 3A will be described in detail with reference to FIGS. 4 to 16. FIG. 4 is a diagram taken along the line IV-IV' of FIGS. 3A and 3B, and FIGS. 5A to 16 are diagrams illustrating processing steps for manufacturing the semiconductor memory device shown in FIG. 3A.

Referring to FIGS. 4, 5A and 5B, a device isolation process may be performed on the substrate 200 to thereby form a device isolation layer 202 at an upper portion of the substrate 200. An active region 300 may be defined by the device isolation layer 202 in a field region. In substantially the same manner as in FIG. 3A, the active region 300 may have a shape of an elliptical bar defined by major and minor axes, and a direction of the major axis of the active region 300 may coincide with a longitudinal direction of the substrate 200, and a direction of the minor axis of the active region 300 may coincide with a latitudinal direction of the substrate 200 in FIGS. 5A and 5B.

In example embodiments, the active region 300 may be repeatedly formed in the longitudinal direction of the substrate 200 to thereby form an active row in the longitudinal direction. The active region 300 may also be repeatedly formed in the latitudinal direction of the substrate 200 to thereby form an active column in such a way that a center of the active region 300 may be shifted from that of an adjacent active region in a neighboring active row. The active region 300 in a first active row may be shifted by a predetermined or given distance from the active region 300 in a second active row adjacent to the first active row. A center shift of the active region 300 may not be performed in the active column, and the active regions 300 may be repeatedly positioned in both of the longitudinal and latitudinal directions of the substrate 200, as shown in FIG. 5B.

The major axis of the active region 300 may not be inclined with respect to the longitudinal direction of the substrate 200 but parallel with the longitudinal direction of the substrate 200, so that the cell structure of example embodiments may be more facilitating than the conventional cell structure in view of a manufacturing process. For example, a conventional illumination system may be used during a photolithography process for forming the cell structure of example embodiments. In example embodiments, a trench isolation layer may be used as the device isolation layer 202 due to an advantage of a higher integration degree.

A pad oxide layer and a pad nitride layer may be formed on the substrate 200, and a patterning process may be performed on the substrate to thereby form a pad oxide pattern and a pad nitride pattern through which the substrate 200 is partially exposed. The substrate 200 may be partially etched off by an etching process using the pad oxide pattern and the pad nitride pattern as an etching mask to thereby form a trench at an upper portion of the substrate 200. A curing process may be further performed on the substrate 200 so as to cure damage to the substrate 200 caused by the etching process. An oxide layer having improved gap-fill characteristics may be formed on a resultant structure including the trench to a sufficient thickness to fill the trench. For example, the oxide layer may be formed on the resultant structure by a plasma-enhanced chemical vapor deposition (PECVD) process. The oxide layer may be removed from the resultant structure until a top surface of the pad nitride layer may be exposed by a chemical mechanical polishing (CMP) process. The pad nitride layer and the pad oxide layer may be removed from the substrate 200 by an etching process using a phosphoric acid as an etchant. The oxide layer may only remain in the trench to thereby form the trench device isolation layer at the upper portion of the substrate 200.

Figure 6A:
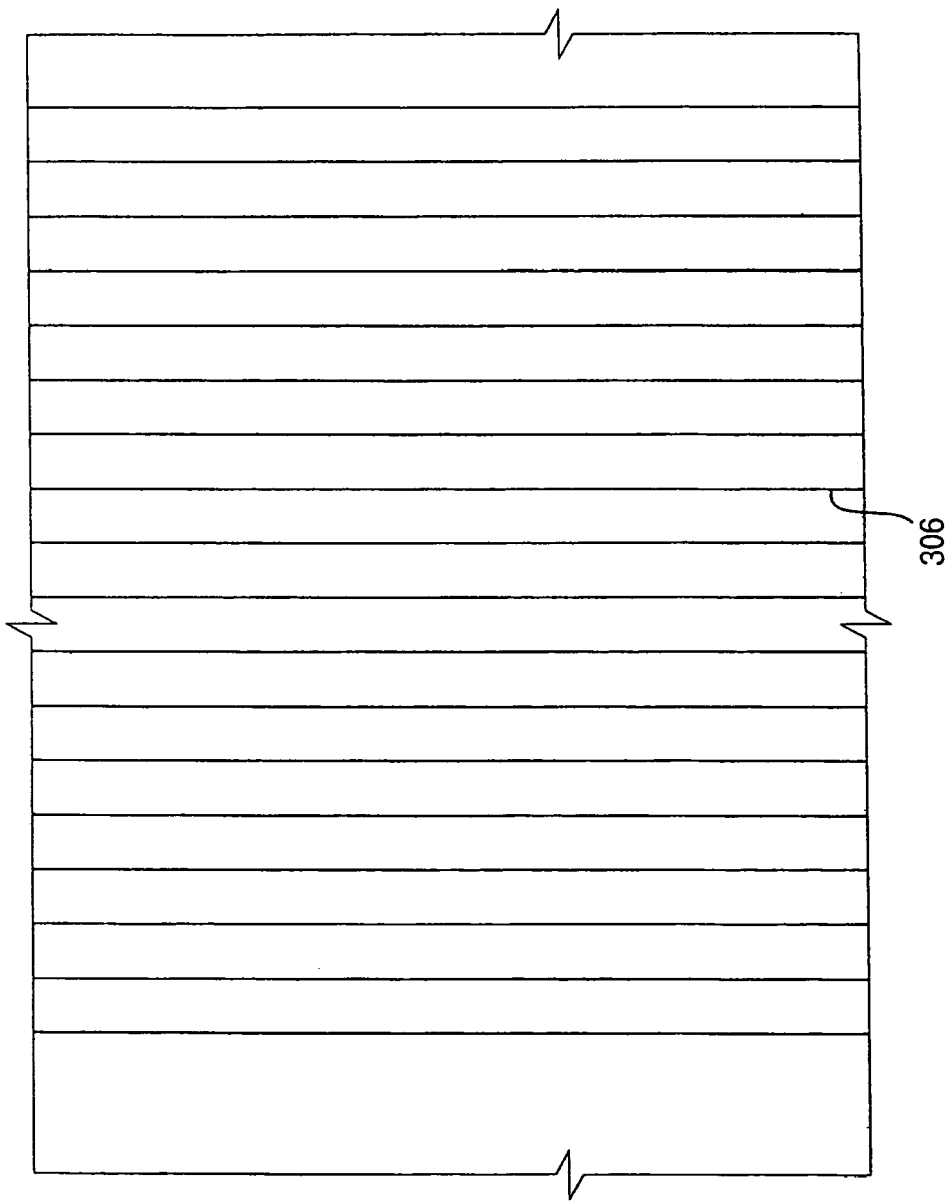

Referring to FIGS. 4, 6A and 7A, a gate pattern 306 may be formed on the substrate 200 on which the active region 300 is defined by a field region including the device isolation layer 202. In example embodiments, the gate pattern 306 may extend in the latitudinal direction of the substrate 200 and may be repeatedly formed in the longitudinal direction of the substrate 200 in such a way that two gate patterns 306 may cross one active region 300. A first gate pattern may cross the active region 300 at a first gap area between a first end portion and a central portion of the active region 300, and a second gate pattern may cross the same active region 300 at a second gap area between a second end portion opposite to the first end portion and the central portion of the active region 300. Only one gate pattern may pass between the active regions 300 in the longitudinal direction of the substrate 200. The gate pattern 306 may be formed on the substrate 200 as shown in FIG. 7A.

As a modified example embodiment shown in FIGS. 6B and 7B, when a center shift of the active region 300 is not performed in the active column, and the active regions 300 may be repeatedly positioned in both the longitudinal and latitudinal directions of the substrate 200 as shown in FIG. 5B, a dummy gate pattern 307 may be further formed between the active columns as well as the gate pattern 306 in the latitudinal direction of the substrate. The gate pattern 306 and the dummy pattern 307 may be formed on the substrate 200 as shown in FIG. 7B. Processing steps for forming the gate pattern 306 on the substrate 200 may be described as follows.

An insulation layer and a conductive layer may be sequentially formed on the substrate 200 including the active region 300. Examples of the insulation layer may include an oxide, a metal oxide and/or a metal oxynitride. These may be used alone and/or in combinations thereof. A metal oxide layer may be used as the insulation layer due to a relatively small equivalent oxide thickness (EOT) and improved leakage current characteristics. In example embodiments, the insulation layer may include the metal oxide and may be formed on the substrate 200 by an atomic layer deposition (ALD) process.

The conductive layer and the insulation layer may be sequentially patterned to thereby form a gate insulation layer and a gate conductive layer on the substrate 200. The gate pattern 306 including the gate insulation layer and the gate conductive layer may be formed on the substrate 200. The patterning process against the conductive layer and the insulation layer may be performed by an etching process using a hard mask layer (e.g., a photoresist pattern) and a nitride as an etching mask. When the hard mask layer is used as the etching mask in the patterning process, the gate pattern 306 may include the hard mask layer on the gate conductive layer.

An ion implantation process may be performed on the substrate using the gate pattern 306 as an implantation mask. Source/drain regions may be formed at surface portions of the active region 300 of the substrate 200 adjacent to the gate pattern 306. The source/drain regions may correspond to the first area 302a and the second area 304a shown in FIG. 3. As described with reference to FIG. 3, the first area 302a may correspond to both of the end portions of the active region 300 and the second area 304a may correspond to the central portion of the active region 300. The source/drain regions in the first area 302a may make electrical contact with the lower electrode contact pad 302, and the source/drain regions in the second area 304a may make electrical contact with the bit-line contact pad 304.

Although not shown in the figures, a spacer (not shown) may also be formed on a sidewall of the gate pattern 306, and the source/drain regions may be formed into a lightly doped source/drain (LDD) structure. Thereafter, a first insulation interlayer 206 may be formed on the substrate 200 including the gate pattern 306, as shown in FIG. 4.

Referring to FIG. 8, the first insulation interlayer 206 may be patterned by a photolithography process, thereby forming a first contact hole through which the first and second areas 302a and 304a are exposed. A conductive material may be filled into the first and second areas 302a and 304a, thereby forming a lower electrode plug 380a electrically connected with the first area 302a, and a bit-line plug 380b electrically connected with the second area 304a. Examples of the conductive material may include polysilicon, metal and/or metal nitride. These may be used alone and/or in a combination thereof.

The first insulation interlayer 206 may be formed on the substrate 200 to a sufficient thickness to cover the gate pattern 306 and may then be removed from the substrate 200 until a top surface of the gate pattern 306 is exposed. The first insulation interlayer 206 may be partially patterned by a photolithography process, thereby forming a first contact hole through which the first and second areas 302a and 304a are exposed. A conductive layer may be formed on the substrate including the first contact hole to a sufficient thickness to fill the first contact hole. The conductive layer may be removed from the substrate 200 until a top surface of the first insulation interlayer 206 is exposed, so that the conductive layer may only remain in the first contact hole to thereby form the lower electrode plug 380a electrically connected to the first area 302a and the bit-line plug 380b electrically connected to the second area 304a, as shown in FIG. 9.

Referring again to FIG. 4, a second insulation interlayer 207 may be formed on the first insulation interlayer 206 including the lower electrode plug 380a and the bit-line plug 380b. The second insulation interlayer 207 may be patterned by a photolithography process to thereby form a second contact hole in which the bit-line contact pad 304 is to be formed. A top surface of the bit-line plug 380b, which is formed at the second area 304a, and a top surface of the first insulation interlayer 206 on the third area 330 in FIG. 3 may be exposed through the second contact hole. As described above with reference to FIG. 3, the third area 330 of the substrate 200 may represent the space on the substrate 200 between the active regions 300 positioned in adjacent active rows and may correspond to the field region that defines the active region 300 of the substrate 200.

Figure 10:
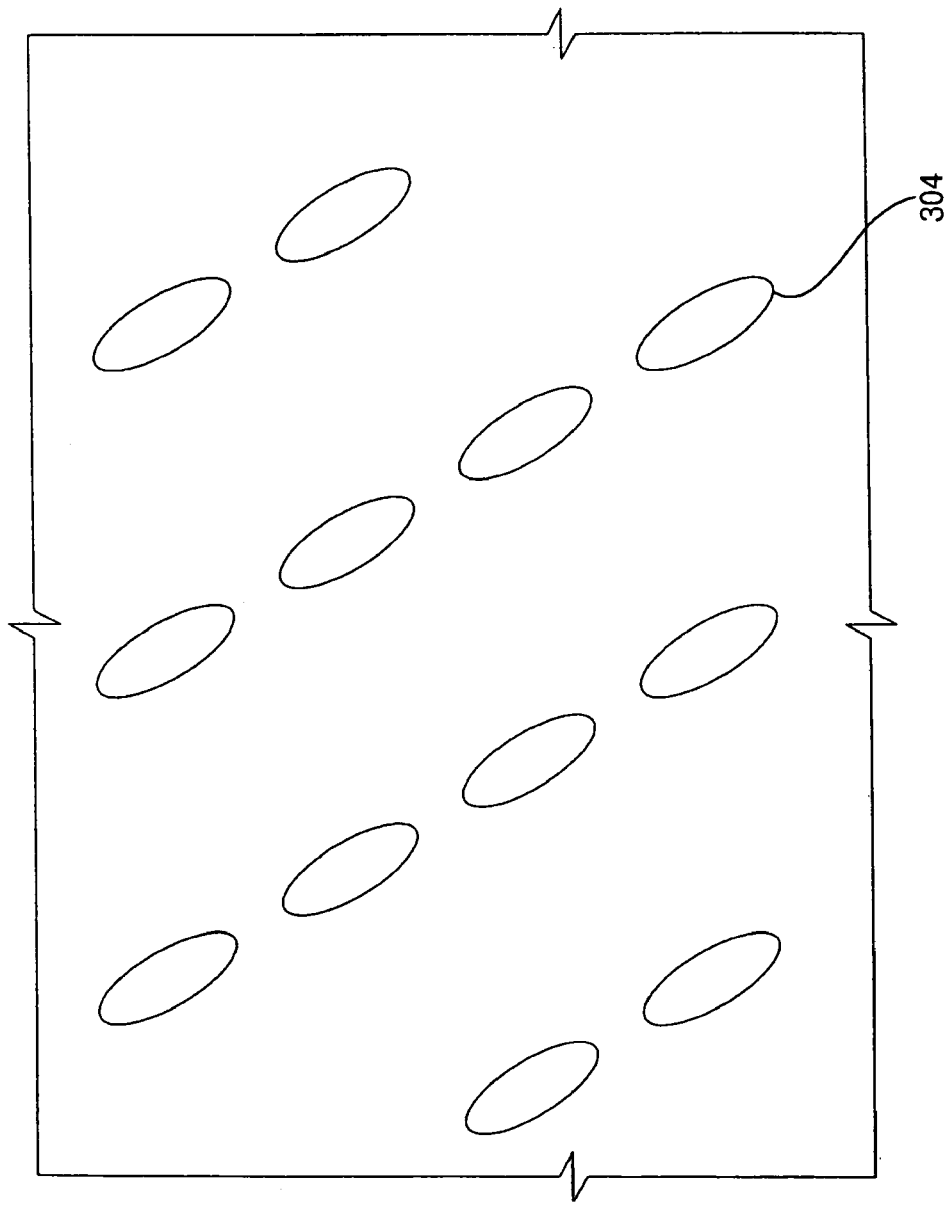
Figure 11:
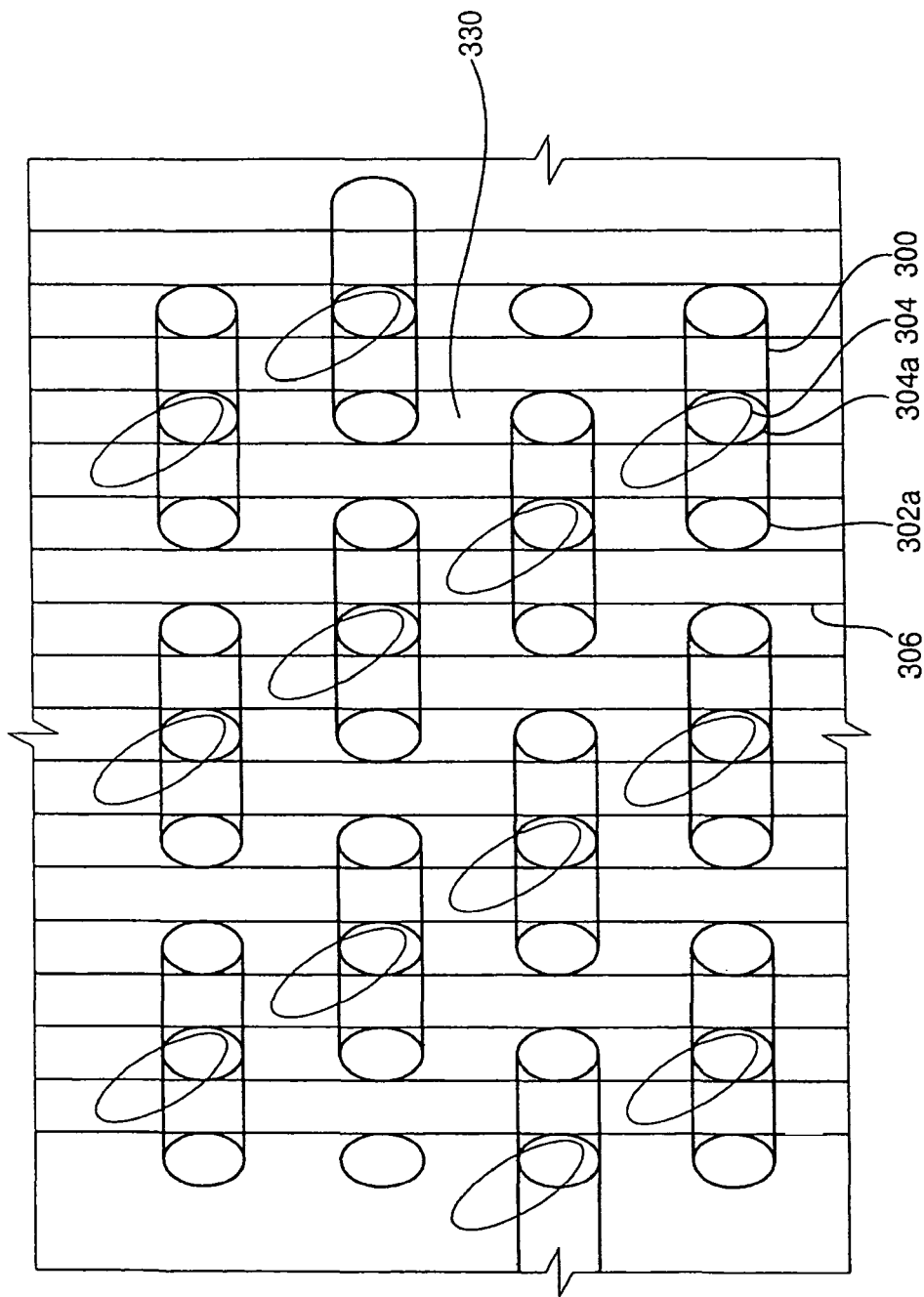

Referring to FIGS. 10 and 11, a conductive material may fill the second contact hole to thereby form the bit-line contact pad 304 that makes contact with the bit-line contact plug 380b. Hereinafter, the bit-line contact pad 304 may include the bit-line contact plug 380b. Examples of the conductive material may include polysilicon, metal and/or metal nitride. These may be used alone or in a combination thereof.

The bit-line contact pad 304 may be formed in the second contact hole by a sequential performance of deposition and planarization processes. In example embodiments, a conductive layer including the conductive material may be formed on a resultant structure including the second contact hole to a sufficient thickness to fill the second contact hole. The conductive layer may be removed from the resultant structure by a planarization process until a top surface of the second insulation interlayer 207 is exposed.

In example embodiments, the bit-line contact pad 304 may make contact with both of the second and third areas 304a and 330, so that the bit-line contact pad 304 is formed into an elliptical shape. When the major axis of the elliptical bit-line contact pad 304 is directed to the minor axis of the active region 300, neighboring bit-line contact pads 304 arranged in series in a direction of the major axis thereof may overlap with each other. A major axis of the elliptical bit-line contact pad 304 may be slightly inclined at an angle with respect to the minor axis of the active region 300. The bit-line contact pad 304 may be formed just by a heat treatment to a photoresist unlike the formation of the active region 300.

Figure 17:
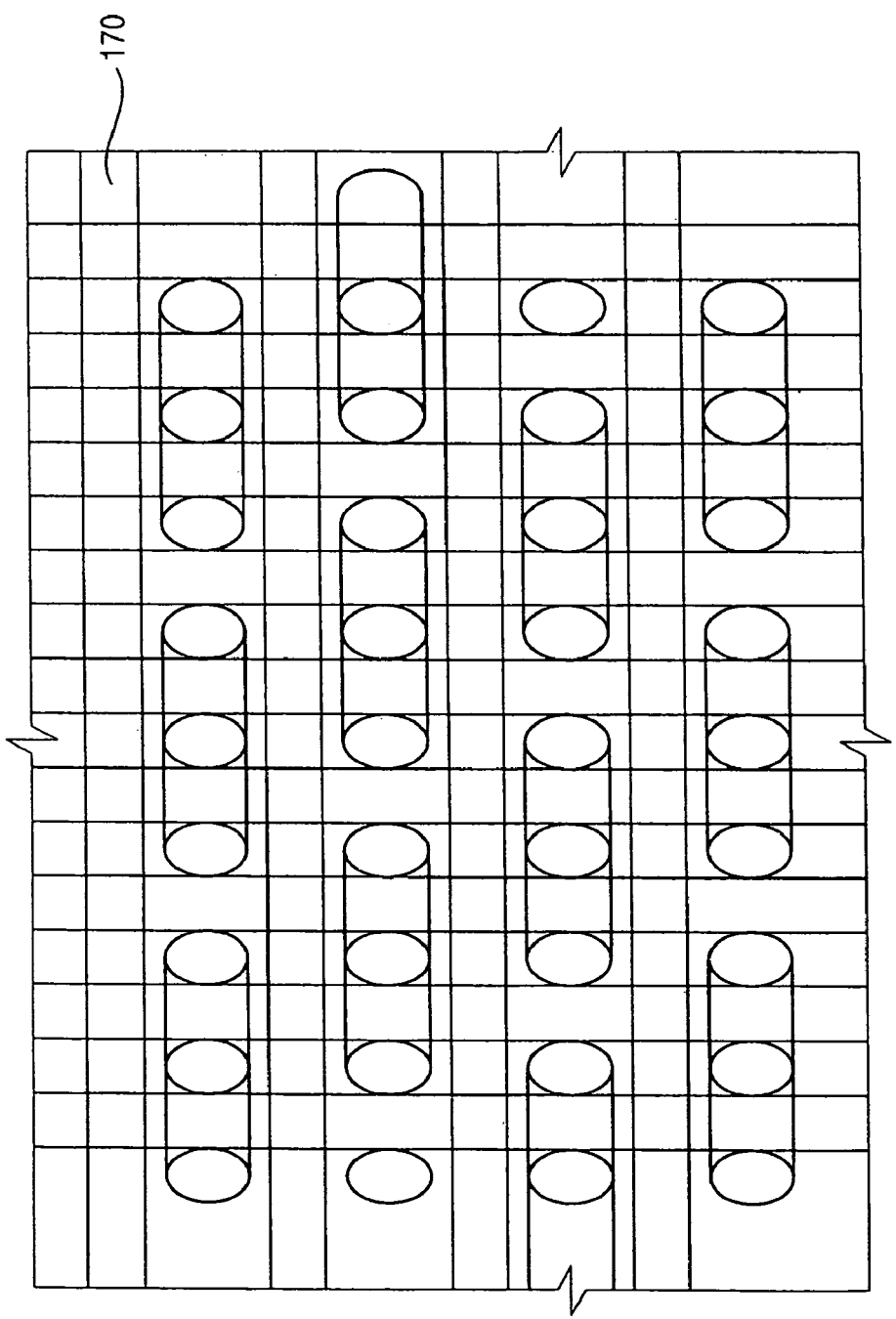
Figure 18:
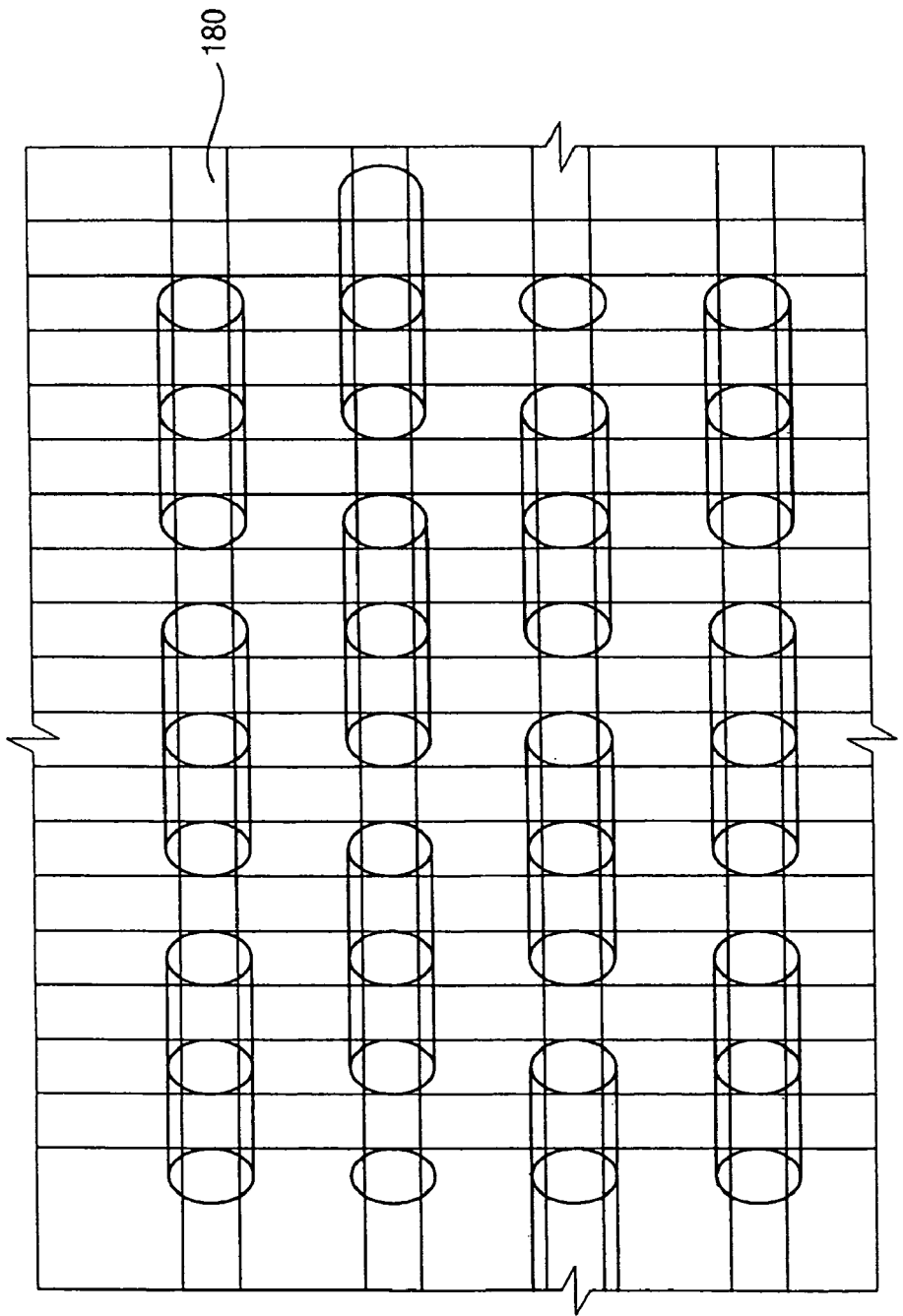

When the bit-line contact pad 304 is formed only in the second area 304a and is not formed in the third area 330, there may be a problem in that a bit line 170 may not make contact with the bit-line contact pad 304 as shown in FIG. 17 and the bit line 170 and may make contact with the lower electrode plug 180 as shown in FIG. 18. The bit-line contact pad 304 of example embodiments may make contact with both the second and third areas 304a and 330.

Figure 12:
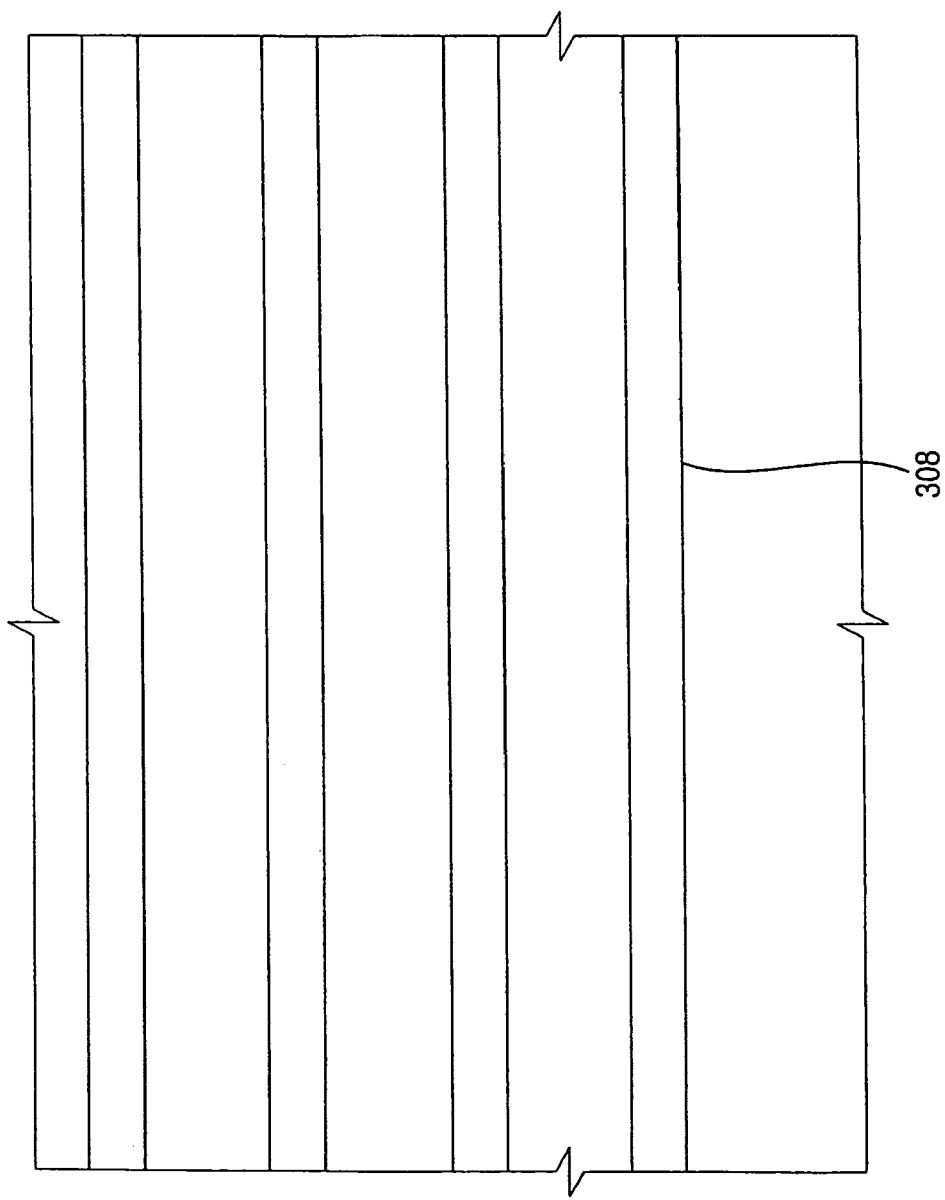
Figure 13:
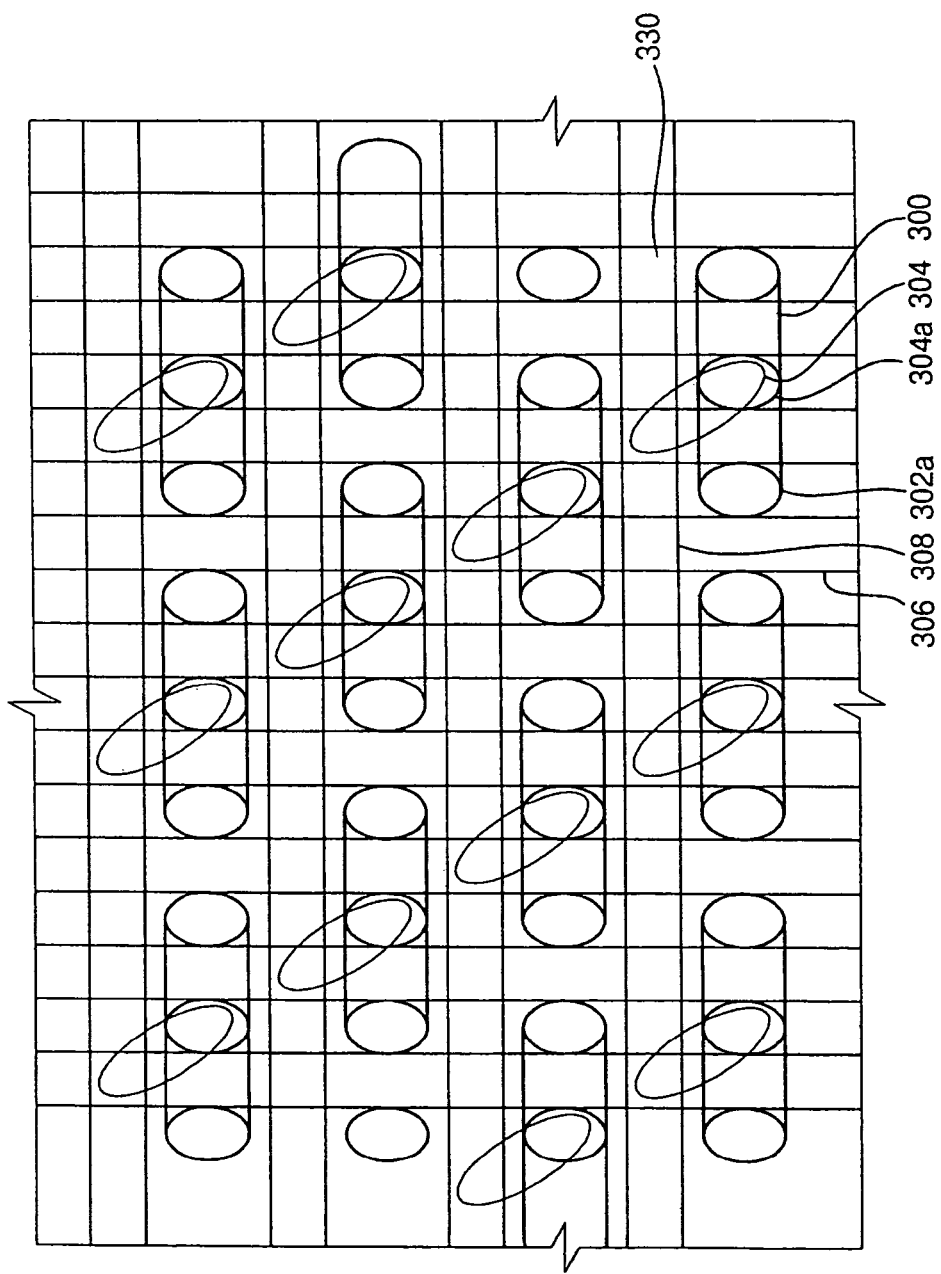

Referring to FIGS. 12 and 13, a bit line 308 may be formed on the second insulation interlayer 207 without overlapping with the active region 300, and may make contact with the bit-line contact pad 304. The bit line 308 may be connected to the bit-line contact pad 304 without making any connection with the lower electrode plug 380a. An extension of the bit-line contact pad 304 to the third area 330 may enable the bit line 308 to make contact with the bit-line contact pad 304 without any connection with the lower electrode plug 380a, thereby improving space efficiency in a memory cell of the semiconductor memory device of example embodiments.

Figure 14:
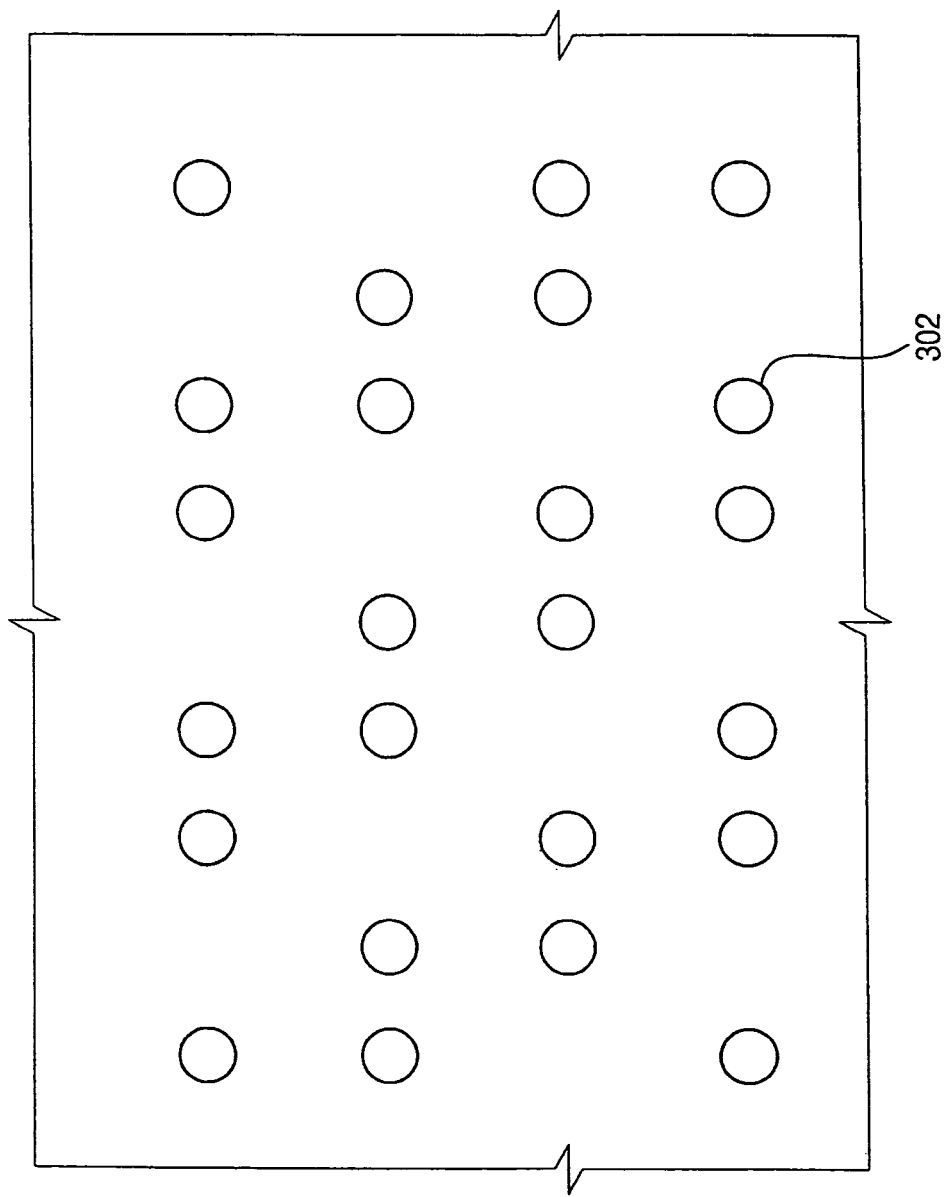
Figure 15:
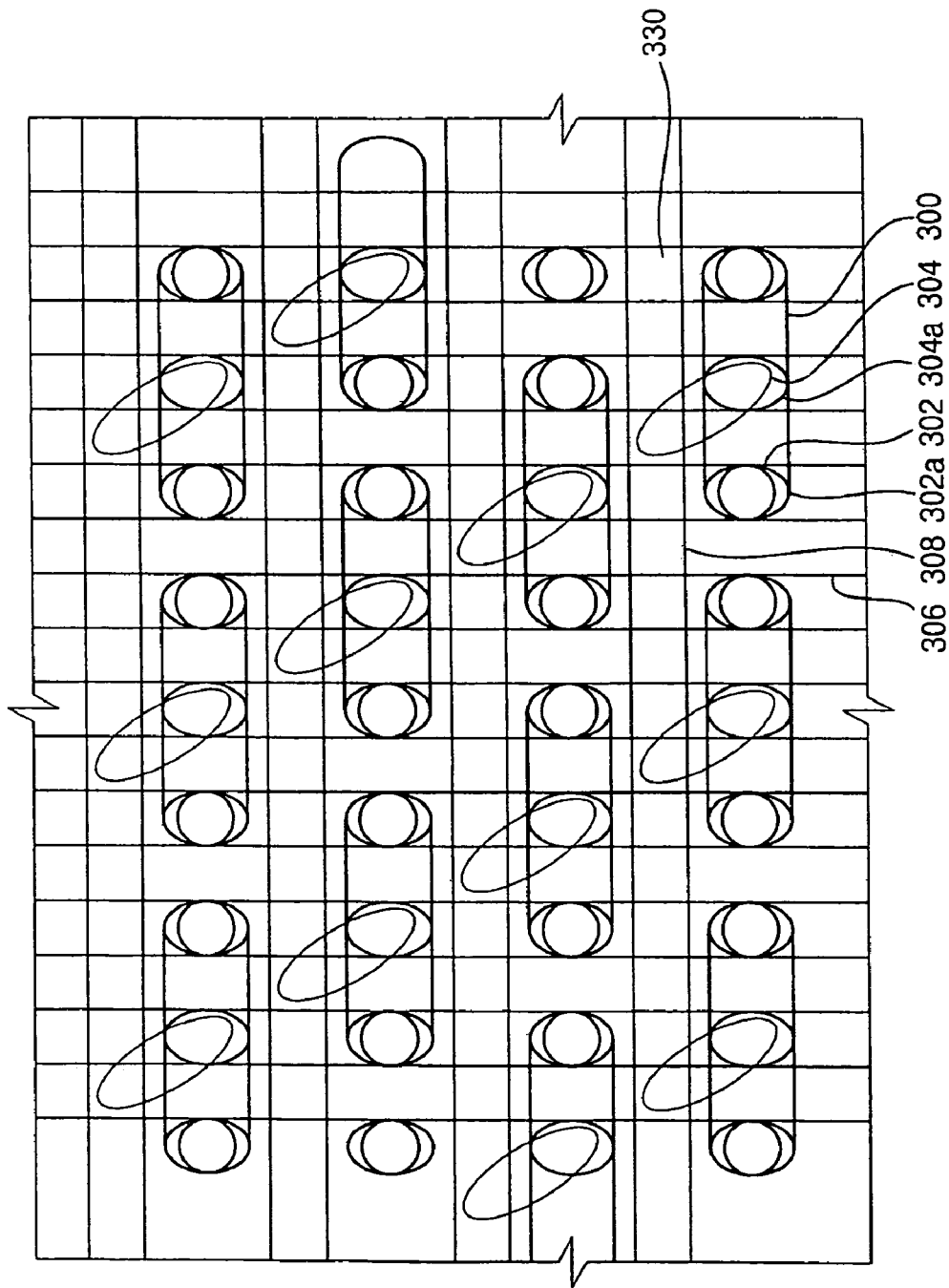

Referring again to FIG. 4, a third insulation interlayer 208 may be formed on the substrate 200 including the bit line 308 and may be patterned by a photolithography process to thereby form a third contact hole through which the lower electrode plug 380a is exposed. Referring to FIGS. 14 and 15, a conductive material may fill the third contact hole to thereby form a lower electrode contact pad 302 electrically connected to the lower electrode plug 380a. Hereinafter, the lower electrode contact pad 302 may include the lower electrode plug 380a for convenience. Examples of the conductive material may include polysilicon, metal and/or metal nitride. These may be used alone and/or in a combination thereof.

Figure 16:
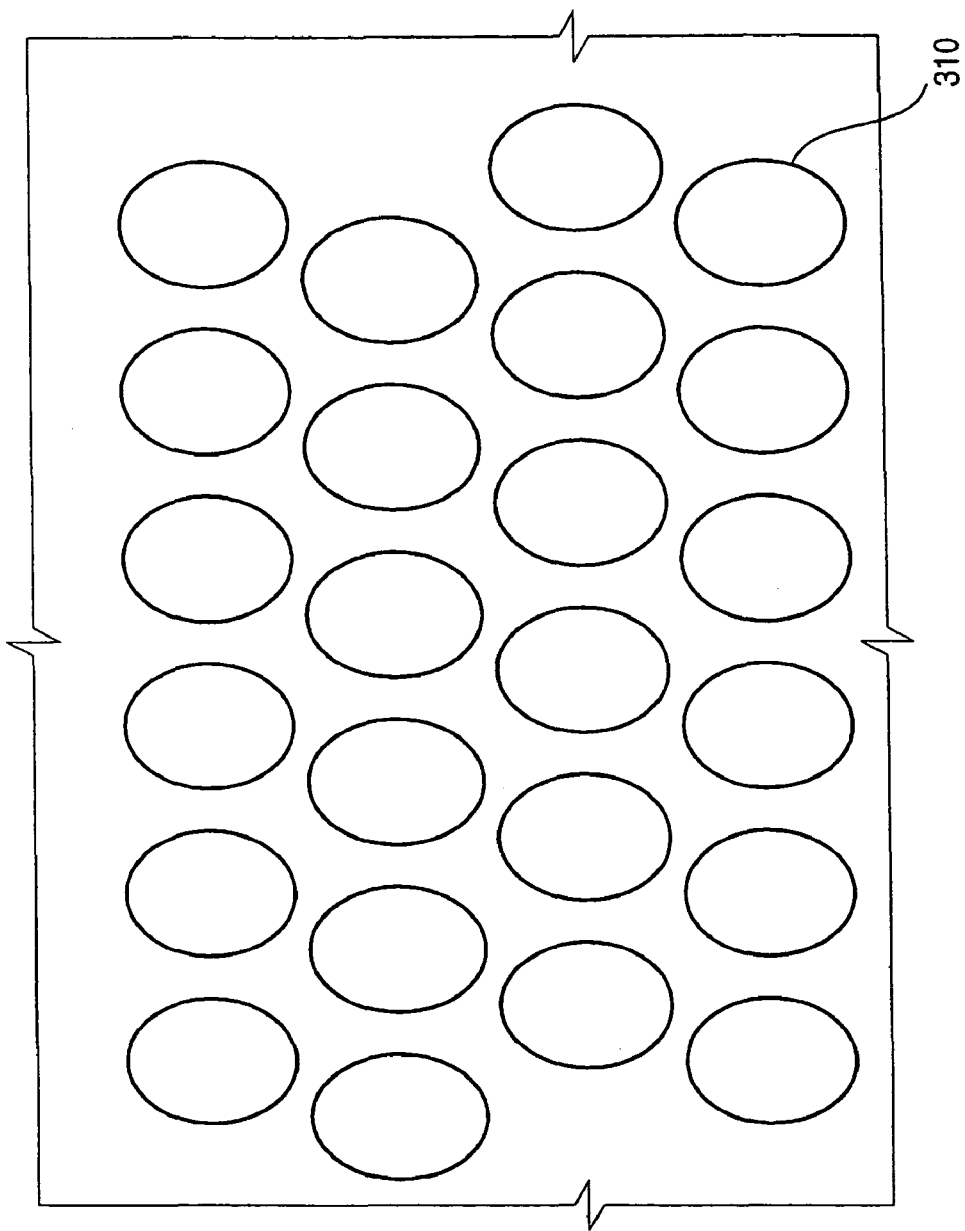

The lower electrode contact pad 302 may be formed in the third contact hole by a sequential performance of deposition and planarization processes. In example embodiments, a conductive layer including the conductive material may be formed on a resultant structure including the third contact hole to a sufficient thickness to fill the third contact hole. The conductive layer may be removed from the resultant structure by a planarization process until a top surface of the third insulation interlayer 208 is exposed. A lower electrode 310 may be formed on the third insulation interlayer 208, and may be electrically connected with the lower electrode contact pad 302 as shown in FIGS. 4 and 16. The lower electrode 310 may be formed over the active region 300. In example embodiments, the lower electrode may be formed into a cylindrical shape in view of an integration degree of the semiconductor memory device. Processing steps for a method of forming the cylindrical lower electrode may be described as follows.

A mold layer may be formed on the third insulation interlayer 208 including an oxide by a chemical vapor deposition (CVD) process. The mold layer may be patterned by an etching process to thereby form an opening through which the lower electrode contact pad 302 is exposed, and a lower electrode thin layer may be continuously formed on a top surface of the mold layer and on the bottom and sidewall of the opening. The lower electrode thin layer may include polysilicon, metal and/or metal nitride. In example embodiments, the lower electrode thin layer may include metal nitride because the metal nitride may be much more desirable for a higher integration degree. A sacrificial layer may be formed on a resultant structure including the lower electrode thin layer to a sufficient thickness to fill the opening. In example embodiments, the sacrificial layer may have substantially the same etching selectivity as the mold layer in a subsequent etching process.

The sacrificial layer and the mold layer may be sequentially removed from the resultant structure, so that the lower electrode thin layer and the sacrificial layer only may remain in the opening. The lower electrode thin layer and the sacrificial layer may be separated on the substrate 200 by every node of the memory device, which is referred to as a node separation. The node separation of the lower electrode and the sacrificial layer may be performed by a CMP process and/or a whole-surface etching process. The mold layer and the sacrificial layer may be removed from the substrate 200, so that the cylindrical lower electrode may be formed on the substrate 200 and may make contact with the lower electrode contact pad 302.

A dielectric layer (not shown) may be formed on a surface of the lower electrode 310. In example embodiments, the dielectric layer may include metal oxide having a relatively small EOT and improved leakage current characteristics. An upper electrode (not shown) may be formed on the dielectric layer. The upper electrode may include polysilicon, a metal and/or a metal nitride in the same manner as described with respect to the lower electrode. In example embodiments, the upper electrode may include metal nitride in view of an integration degree. A capacitor, which is electrically connected with the lower electrode contact pad 302, may be formed on the substrate 200.

According to a cell structure of a semiconductor memory device including a $6F^2$ unit cell, the active region may be repeatedly positioned in a longitudinal direction of the substrate to thereby form an active row in the longitudinal direction. The active region may also be repeatedly formed in a latitudinal direction of the substrate to thereby form an active column in such a way that a center of the active region is shifted from that of an adjacent active region in a neighboring active row. A bit-line contact pad may be formed in such a way that one portion of the bit-line contact pad is positioned on a portion of the active region, and the other portion of the bit-line contact pad may be positioned on a field region corresponding to a substrate between two active regions, each of which may be included in neighboring active rows. The cell structure of a semiconductor memory device may be more easily formed on the substrate despite a 6F²-structured unit cell, thereby improving an integration degree of the semiconductor memory device.

Although the example embodiments have been described, it is understood that example embodiments should not be limited to these example embodiments but various changes and modifications may be made by one skilled in the art within the spirit and scope as hereinafter claimed.

What is claimed is:

1. A semiconductor memory device comprising:
    a plurality of active regions of a substrate, each of the active regions having a first area at both end portions and a second area at a central portion;
    a bit-line contact pad of which a first portion is positioned on the second area of the plurality of active regions, and a second portion is positioned on a third area of the substrate that does not overlap with the plurality of active regions; and
    a bit line electrically connected with the bit-line contact pad at the third area of the substrate, so that the bit line does not overlap with the plurality of active regions,
    wherein the plurality of active regions includes an elliptical shape having a major axis and a minor axis and the plurality of active regions being repeatedly positioned in a direction of the major axis to thereby form an active row, and being repeatedly positioned in a direction of the minor axis in such a structure that a center of the plurality of active regions is shifted from that of an adjacent active region in a neighboring active row to thereby form an active column, and
    wherein the bit-line contact pad has an elliptical shape in such a structure that a major axis of the bit-line contact pad is inclined with respect to the minor axis of the plurality of active regions.

2. The semiconductor memory device of claim 1, wherein the centers of the plurality of active regions of the active column are on an oblique line that is inclined at an angle θ(0°<θ<90°) with respect to the active row.

3. The semiconductor memory device of claim 1, wherein the third area of the substrate corresponds to a portion of the substrate between a pair of the plurality of active regions, each of which is included in neighboring active rows.

4. The semiconductor memory device of claim 3, wherein the third area of the substrate includes a field region that defines each of the plurality of active regions.

5. The semiconductor memory device of claim 1, wherein a lower electrode contact pad is positioned on the first area of the plurality of active regions and occupies a lattice surface of the plurality of active regions at about 3F×2F (wherein capital letter 'F' denotes a minimized line width of the semiconductor memory device), so that a unit cell of the semiconductor memory device includes a 6F² structure.

6. A semiconductor memory device comprising:
    a plurality of active regions of a substrate, each of the active regions having a first area at both end portions and a second area at a central portion;
    a bit-line contact pad of which a first portion is positioned on the second area of the plurality of active regions, and a second portion is positioned on a third area of the substrate that does not overlap with the plurality of active regions; and
    a bit line electrically connected with the bit-line contact pad at the third area of the substrate, so that the bit line does not overlap with the plurality of active regions,
    wherein the plurality of active regions includes an elliptical shape having a major axis and a minor axis, and each of the plurality of active regions are repeatedly positioned in a direction of the major axis to thereby form an active row and repeatedly positioned in a direction of the minor axis in such a structure that the plurality of active regions are aligned in both the directions of the major axis and minor axis to thereby form an active column, and
    wherein the bit-line contact pad has an elliptical shape in such a structure that a major axis of the bit-line contact pad is inclined with respect to the minor axis of the plurality of active regions.

7. A semiconductor memory device comprising:
    a plurality of active regions of a substrate, each of the active regions having a first area at both end portions and a second area at a central portion;
    a bit-line contact pad of which a first portion is positioned on the second area of the plurality of active regions, and a second portion is positioned on a third area of the substrate that does not overlap with the plurality of active regions; and
    a bit line electrically connected with the bit-line contact pad at the third area of the substrate, so that the bit line does not overlap with the plurality of active regions
    a plurality of gate patterns extending in the direction of the minor axis of the plurality of active regions and crossing gap areas of the plurality of active regions between the first and second areas of the plurality of active regions;
    a lower electrode contact pad that makes contact with the first area of the plurality of active regions;
    a capacitor including a lower electrode that makes contact with the lower electrode contact pad, a dielectric layer on the lower electrode and an upper electrode on the dielectric layer; and
    a dummy gate pattern positioned between the active columns and extending in the direction of the minor axis of the plurality of active regions.

8. The semiconductor memory device of claim 7, wherein the third area of the substrate may include a field region for defining the plurality of active regions corresponding to a portion of the substrate between a pair of the plurality of active regions, each of which is included in neighboring active rows.

* * * * *